(12) United States Patent
Watanabe et al.

(10) Patent No.: US 7,786,493 B2
(45) Date of Patent: Aug. 31, 2010

(54) LIGHT EMITTING DIODE, METHOD FOR MANUFACTURING LIGHT EMITTING DIODE, INTEGRATED LIGHT EMITTING DIODE, METHOD FOR MANUFACTURING INTEGRATED LIGHT EMITTING DIODE, LIGHT EMITTING DIODE BACKLIGHT, LIGHT EMITTING DIODE ILLUMINATION DEVICE, LIGHT EMITTING DIODE DISPLAY, ELECTRONIC APPARATUS, ELECTRONIC DEVICE, AND METHOD FOR MANUFACTURING ELECTRONIC DEVICE

(75) Inventors: Yoshiaki Watanabe, Kanagawa (JP); Tomonori Hino, Kanagawa (JP)

(73) Assignee: Sony Corporation, Tokyo (JP)

( * ) Notice: Subject to any disclaimer, the term of this patent is extended or adjusted under 35 U.S.C. 154(b) by 802 days.

(21) Appl. No.: 11/619,347

(22) Filed: Jan. 3, 2007

(65) Prior Publication Data
US 2008/0210957 A1    Sep. 4, 2008

(30) Foreign Application Priority Data
Jan. 6, 2006    (JP)    ............................ P2006-001537

(51) Int. Cl.
*H01L 29/18*    (2006.01)
(52) U.S. Cl. .................... 257/88; 257/89; 257/E33.062
(58) Field of Classification Search .................... 257/88, 257/89, 99, E33.062
See application file for complete search history.

(56) References Cited
U.S. PATENT DOCUMENTS

| | | | |
|---|---|---|---|
| 6,194,743 B1 | 2/2001 | Kondoh et al. | |
| 6,794,690 B2 | 8/2004 | Uemura | |
| 6,900,472 B2 | 5/2005 | Kondoh et al. | |
| 6,940,099 B2 * | 9/2005 | Hata et al. | 257/98 |
| 6,977,395 B2 * | 12/2005 | Yamada et al. | 257/99 |
| 7,009,218 B2 | 3/2006 | Sugimoto et al. | |
| 7,544,974 B2 * | 6/2009 | Kamei | 257/99 |
| 7,593,442 B2 * | 9/2009 | Kishimoto | 372/38.05 |

FOREIGN PATENT DOCUMENTS

| | | |
|---|---|---|
| JP | 6-069546 A | 3/1994 |
| JP | 6-112532 A | 4/1994 |
| JP | 9-167860 A | 6/1997 |

(Continued)

OTHER PUBLICATIONS

Japanese Patent Office, Office Action issued in Patent Application JP2006-001537, on Sep. 1, 2009.

*Primary Examiner*—Roy K Potter
(74) *Attorney, Agent, or Firm*—Sonnenschein Nath & Rosenthal LLP

(57) ABSTRACT

Disclosed herein is a light emitting diode includes: a first semiconductor layer of a first conductivity type; an active layer on the first semiconductor layer; a second semiconductor layer of a second conductivity type on the active layer; a first electrode configured to be electrically coupled to the first semiconductor layer; and a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum.

10 Claims, 30 Drawing Sheets

FOREIGN PATENT DOCUMENTS

| | | |
|---|---|---|
| JP | 111-186598 | 7/1999 |
| JP | 2002-111059 A | 4/2002 |
| JP | 2002-324915 A | 11/2002 |
| JP | 2002-344031 A | 11/2002 |
| JP | 2003-168823 | 6/2003 |
| JP | 2003-243705 | 8/2003 |
| JP | 2004-274042 | 9/2004 |
| JP | 2004-349595 | 12/2004 |
| JP | 2005-101212 A | 4/2005 |
| JP | 2005-197296 A | 7/2005 |
| JP | 2005-260244 A | 9/2005 |
| WO | 2003-007390 A1 | 1/2003 |

* cited by examiner

SOLDER PATTERNS THAT HAVE BECOME VISIBLE DUE TO DIFFUSION THEREOF

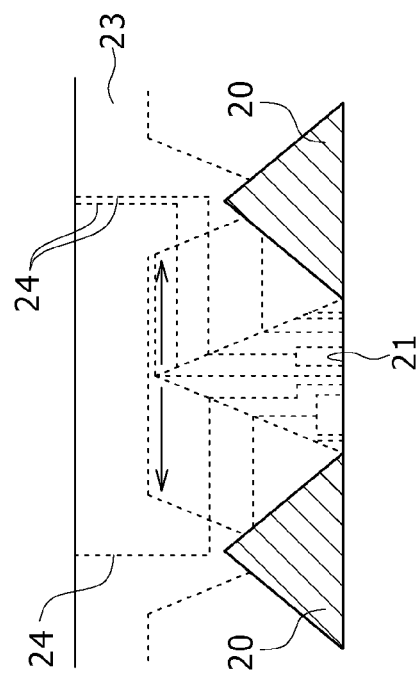
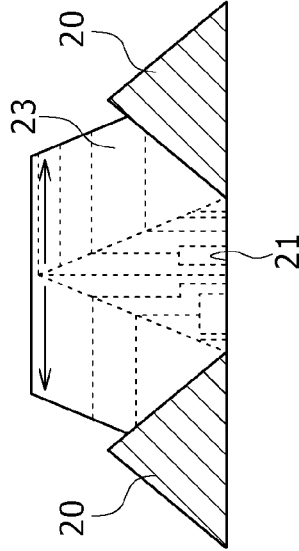
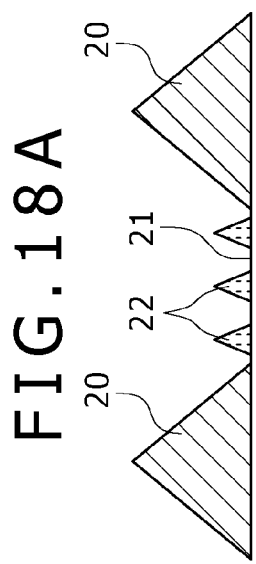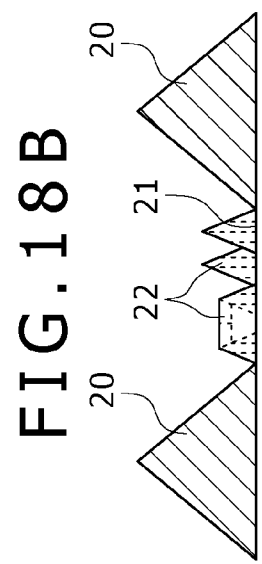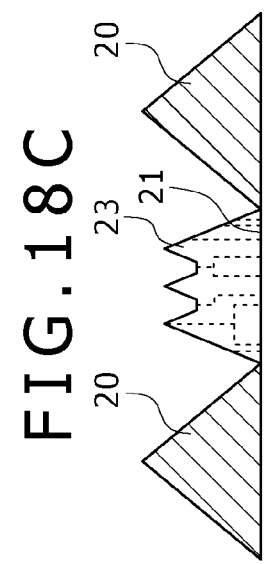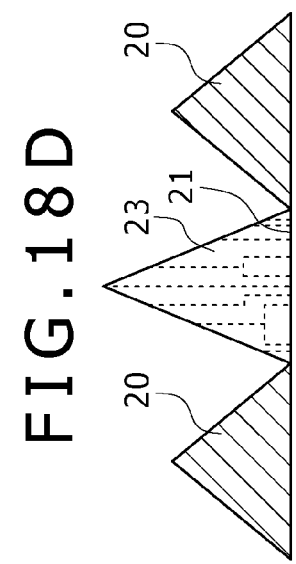

LIGHT

LIGHT EMITTING DIODE, METHOD FOR MANUFACTURING LIGHT EMITTING DIODE, INTEGRATED LIGHT EMITTING DIODE, METHOD FOR MANUFACTURING INTEGRATED LIGHT EMITTING DIODE, LIGHT EMITTING DIODE BACKLIGHT, LIGHT EMITTING DIODE ILLUMINATION DEVICE, LIGHT EMITTING DIODE DISPLAY, ELECTRONIC APPARATUS, ELECTRONIC DEVICE, AND METHOD FOR MANUFACTURING ELECTRONIC DEVICE

CROSS REFERENCES TO RELATED APPLICATIONS

The present invention contains subject matter related to Japanese Patent Application JP 2006-001537 filed in the Japanese Patent Office on Jan. 6, 2006, the entire contents of which being incorporated herein by reference.

BACKGROUND OF THE INVENTION

1. Field of the Invention

The present invention relates to a light emitting diode, a method for manufacturing a light emitting diode, an integrated light emitting diode, a method for manufacturing an integrated light emitting diode, a light emitting diode backlight, a light emitting diode illumination device, a light emitting diode display, an electronic apparatus, an electronic device, and a method for manufacturing an electronic device. The present invention can be suitably applied to e.g. light emitting diodes employing a nitride III-V compound semiconductor and various kinds of devices and apparatuses employing this light emitting diode.

2. Description of the Related Art

GaN-based semiconductors allow emission of light in the visible range. In recent years, high-intensity light emitting diodes (LEDs) employing the GaN-based semiconductors are being actively developed.

In order for the high-intensity GaN-based LED to have enhanced light extraction efficiency, pure Ag, which has a high reflectivity with respect to light in the blue and green wavelength bands, is frequently used as the material of a p-electrode that forms an ohmic contact to a p-type semiconductor layer.

However, the Ag electrode involves the following problems.

1. Pure Ag originally shows low resistance (is sensitive) to oxidation and sulfuration and thus is readily affected by capturing of oxygen and sulfur therein from an exposure environment so as to suffer from deterioration of its reflectivity. In particular, an Ag film obtained through vacuum evaporation, which is generally used to form the electrode, involves imperfection in the grain boundary structure and so on in the film and hence shows more significant deterioration.

2. The heat resistance of an Ag film is low, and therefore optical properties and electrical properties of an Ag film are readily varied even through heating at a temperature of as low as about 300 to 400° C.

3. Ag itself is extremely easily ionized, which leads to fears of interdiffusion in the device structure, occurrence of whiskers in an LED package due to migration, and other troubles. The presence of water makes the fears more serious.

4. A GaN-based LED is sealed with resin in general. However, deterioration attributed to traces of water and sulfur contained in resin is often found.

In order to prevent, of these problems, the migration of Ag in particular, there has been proposed a solution in which a protective sheet serving as a migration barrier is formed to cover the surface of an Ag electrode formed on a p-type semiconductor layer (refer to e.g. Japanese Patent Laid-open No. 2003-243705 (hereinafter referred to as Patent Document 1)). Furthermore, as the material of the protective sheet, a metal containing at least one of Ni, Ti, W, Al, Cr, Cu, Au, Sn, Rh, Re, and Ru is disclosed.

SUMMARY OF THE INVENTION

According to the knowledge of the present inventors, however, it is difficult for the structure proposed in Patent Document 1 to prevent the migration of Ag although the surface of an Ag electrode is covered by a protective sheet composed of the above-cited metal. Therefore, the structure involves a problem of deterioration of the reflectivity and electric properties of the electrode.

Therefore, it is desirable to provide the following light emitting diode, a method for manufacturing the same, an integrated light emitting diode including the light emitting diode, and a method for manufacturing the same. Specifically, the light emitting diode is allowed to achieve substantially complete prevention of silver migration although it includes a silver electrode, more generally an electrode composed mainly of silver. Therefore, the light emitting diode is allowed to achieve a stable and high-performance electrode having excellent environmental resistance, and hence has high performance, a long life, and high reliability.

It is further desirable to provide a high-performance light emitting diode backlight, light emitting diode illumination device, light emitting diode display, and an electronic apparatus that each employ the above-described light emitting diode.

There is a further need for the present invention to provide an electronic device that encompasses a light emitting diode, semiconductor laser, transistor, and other devices, and a method for manufacturing the same.

The above-described needs and other needs will become apparent from description in the present specification with reference to accompanying drawings.

The present inventors have found, through our concentrated research to address the above-described needs, that palladium (Pd) and platinum (Pt) are especially far superior to the metals disclosed in Patent Document 1, specifically, Ni, Ti, W, Al, Cr, Cu, Au, Sn, Rh, Re, and Ru, as the material of a protective sheet that covers the surface of an Ag electrode or an electrode composed mainly of Ag to prevent Ag migration. The use of Pd or Pt as the material of a protective sheet for an Ag electrode is not described in Patent Document 1 at all. Furthermore, any other document does not disclose the use of Pd or Pt as far as the present inventors know.

The present invention is devised as a result of a further detailed study based on the research by the present inventors.

According to a first embodiment of the present invention, there is provided a light emitting diode that includes a first semiconductor layer of a first conductivity type, an active layer on the first semiconductor layer, a second semiconductor layer of a second conductivity type on the active layer, a first electrode configured to be electrically coupled to the first semiconductor layer, and a second electrode configured to be provided on the second semiconductor layer and be electrically coupled to the second semiconductor layer. The second electrode includes a first metal film that has a predetermined shape and is composed mainly of silver and a second metal film that covers the first metal film and is composed mainly of palladium and/or platinum.

According to a second embodiment of the present invention, there is provided a method for manufacturing a light emitting diode. The method includes the steps of sequentially growing a first semiconductor layer of a first conductivity type, an active layer, and a second semiconductor layer of a second conductivity type over a substrate, forming a first electrode electrically coupled to the first semiconductor layer, and forming a first metal film that has a predetermined shape and is composed mainly of silver on the second semiconductor layer, and forming a second metal film that covers the first metal film and is composed mainly of palladium and/or platinum, to thereby form a second electrode electrically coupled to the second semiconductor layer.

In the first and second embodiments, the first metal film may have any composition basically as long as it is composed mainly of silver (90 atomic % or more, for example). Specifically, the first metal film is composed of pure silver (100% silver) or a silver alloy. Examples of the silver alloy include a silver (Ag)-palladium (Pd)-copper (Cu) alloy (the Pd content is 0.5 to 4.9 atomic %, and the Cu content is 0.1 to 3.5 atomic % for example), a silver (Ag)-niobium (Nb)-copper (Cu) alloy (the Nb content is 0.5 to 4.9 atomic %, and the Cu content is 0.1 to 3.5 atomic % for example), and a silver (Ag)-indium (In) alloy (the In content is at most 1 weight % for example). The first metal film composed of a silver alloy shows a reduced tendency of occurrence of Ag migration compared with that composed of pure silver. In that sense, it is desirable that the first metal film is composed of a silver alloy. The thickness of the first metal film is adequately selected depending on intended properties of the first metal film, such as the light reflection performance (reflectivity) and the electric resistivity of the first metal film. In general, the thickness is set to e.g. 30 nm or more. The second metal film may have any composition basically as long as it is composed mainly of palladium and/or platinum (e.g., 90 atomic % or more, preferably, 95 atomic % or more). Preferably, the second metal film is composed of pure palladium (100% palladium), pure platinum (100% platinum), or a palladium-platinum alloy (the Pt content is higher than 0 atomic % and lower than 100 atomic %). Examples of a metal contained in the second metal film other than palladium and/or platinum include copper. The thickness of the second metal film is selected depending on need. It is desirable that the thickness is at least 10 nm in terms of achievement of a sufficient effect of preventing the migration of Ag contained in the first metal film by the second metal film. It is more desirable that the thickness is as large as possible as long as there is no other problem. The first and second metal films may be in direct contact with each other. Alternatively, they may be in indirect contact with each other with the intermediary of an electrically conductive intermediate layer different from both the first and second metal films. It is desirable that the intermediate layer is composed of a metal that hardly forms an alloy with both the first and second metal films. Specifically, it is composed of e.g. at least one metal selected from the group consisting of nickel, titanium, and platinum. The thickness of the intermediate layer is selected depending on need. In general, a thickness of 1 nm or more is sufficient. If a layer (e.g., a pad electrode or solder layer) containing a metal that easily diffuses such as tin (Sn) or gold (Au) is formed above the second metal film, it is preferable that a third metal film composed of e.g. at least one metal selected from the group consisting of tungsten, molybdenum, and titanium is provided on the second metal film, in order to prevent tin and gold from reacting with the second metal film. Specifically, the third metal film is composed of an elemental metal of tungsten, molybdenum or titanium, or composed of TiW, TiMo, WMo, or TiWMo. If the light emitting diode has a mesa portion and dry etching is used for formation of the mesa portion, it is preferable that a fourth metal film composed of a metal that has resistance to dry etching is provided to cover the third metal film, in order to prevent the first to third metal films from being etched in the formation of the mesa portion. If the third metal film is not formed, the fourth metal film is provided to cover the second metal film. Furthermore, if a gold plated layer is provided above the second metal film, it is preferable that a fifth metal film composed mainly of palladium and/or platinum is provided between the gold plated layer and the second metal film, in order to prevent silver from migrating into the gold plated layer when the migration of the silver from the first metal film occurs due to any cause. For the formation of the first to fifth metal films, any of various film deposition methods such as vacuum evaporation (including chemical vacuum evaporation), sputtering, chemical vapor deposition (CVD), and plating can be used so that the optimal method is selected from these methods depending on need. For the formation of the second metal film in particular, it is desirable to use a method that can offer favorable step coverage, such as sputtering or plating.

The first semiconductor layer, the active layer, and the second semiconductor layer may be composed of any semiconductor basically. Specifically, examples of the semiconductor are as follows: nitride III-V compound semiconductors; other semiconductors having a wurtzite structure, more generally a hexagonal crystal structure, such as oxide semiconductors typified by e.g. ZnO, α-ZnS, α-CdS, and α-CdSe; and other various semiconductors having another crystal structure. In one typical example, the first semiconductor layer is an n-type semiconductor layer and the second semiconductor layer is a p-type semiconductor layer.

A method for growing the first semiconductor layer, the active layer, and the second semiconductor layer is adequately selected depending on the kind of semiconductor. For example, any of various epitaxial growth methods such as metal organic chemical vapor deposition (MOCVD) and molecular beam epitaxy (MBE) can be used.

If the first semiconductor layer, the active layer, and the second semiconductor layer are composed of a nitride III-V compound semiconductor, more generally a semiconductor having a wurtzite structure in particular, any of various known methods can be used as a method for manufacturing this light emitting diode. Preferably, the following manufacturing method is used. Specifically, if the first semiconductor layer, the active layer, and the second semiconductor layer are composed of e.g. a nitride III-V compound semiconductor, in a preferable method for manufacturing the light emitting diode, a substrate that has plural projections on its major face is used. The projections are composed of a material different from that of the substrate. The method includes the step of growing first nitride III-V compound semiconductor layers in recesses of the substrate via the state where each of the first nitride III-V compound semiconductor layers has a sectional shape of a triangle of which base is the bottom face of the recess. The method includes also the step of growing a second nitride III-V compound semiconductor layer on the substrate through lateral growth from the first nitride III-V compound semiconductor layers. Furthermore, the method includes the step of sequentially growing, on the second nitride III-V compound semiconductor layer, a third nitride III-V compound semiconductor layer of a first conductivity type (corresponding to the first semiconductor layer), an active layer, and a fourth nitride III-V compound semiconductor layer of a second conductivity type (corresponding to the second semiconductor layer). The conductivity types of the first and second nitride III-V compound semiconductor layers are not limited but may be any of the p-type, n-type, and i-type. The conductivity types of both the layers may be the same or not. Furthermore, two or more parts of which conductivity types are different from each other may be included in the first nitride III-V compound semiconductor layer and/or second nitride III-V compound semiconductor layer. Alternatively, this light emitting diode preferably includes a substrate that has on its major face plural projections composed of a material different from that of the substrate, and a fifth nitride III-V compound semiconductor layer grown on the substrate without formation of gaps in recesses of the substrate. The light emitting diode includes also a third nitride III-V compound semiconductor layer of a first conductivity type, an active layer, and a fourth nitride III-V compound semiconductor layer of a second conductivity type that are formed over the fifth nitride III-V compound semiconductor layer. In the fifth nitride III-V compound semiconductor layer, dislocations generated from the interfaces with the bottom faces of the recesses in the direction perpendicular to the one major face reach the slopes or the vicinities thereof of triangle parts of which bases are the bottom faces of the recesses, and bend therefrom to a direction parallel to the one major face. In this light emitting diode, the fifth nitride III-V compound semiconductor layer corresponds to the first and second nitride III-V compound semiconductor layers in the above-described method for manufacturing a light emitting diode.

In the above-described method for manufacturing a light emitting diode, the growth of the first nitride III-V compound semiconductor layers is started from the bottom faces of the recesses of the substrate, so that the first nitride III-V compound semiconductor layers are grown via the state where each of the first nitride III-V compound semiconductor layers has a sectional shape of a triangle of which base is the bottom face of the recess. This growth way can fill the recesses without gaps therein. From the thus grown first nitride III-V compound semiconductor layers, the second nitride III-V compound semiconductor layer is grown by lateral growth. During the growth of the first nitride III-V compound semiconductor layers, in the first nitride III-V compound semiconductor layers, dislocations are generated from the interfaces with the bottom faces of the recesses of the substrate in the direction perpendicular to one major face of the substrate. These dislocations reach the slopes or the vicinities thereof of the first nitride III-V compound semiconductor layers. Furthermore, along with the growth of the second nitride III-V compound semiconductor layer, the dislocations bend from the slopes or the vicinities thereof to a direction parallel to the one major face of the substrate. At the timing when the second nitride III-V compound semiconductor layer has been grown to a sufficient thickness, the dislocation density in part above the dislocations parallel to the one major face of the substrate is extremely low. Furthermore, this method allows the first to fourth nitride III-V compound semiconductor layers to be grown through one time of epitaxial growth. In addition, it is much easier to form on the substrate the projections composed of a material different from that of the substrate, than to form recesses and projections through direct processing of the substrate by dry etching or the like. Moreover, higher processing accuracy is obtained in general. According to the method for manufacturing a light emitting diode, no gap is formed between the substrate and the first and second nitride III-V compound semiconductor layers, which can greatly improve the light extraction efficiency. Furthermore, the crystallinity of the second nitride III-V compound semiconductor layer is favorable, and hence the crystallinity of the third nitride III-V compound semiconductor layer, the active layer, and the fourth nitride III-V compound semiconductor layer that are grown over the second nitride III-V compound semiconductor layer is also significantly enhanced. Thus, a light emitting diode having extremely high light emission efficiency can be obtained. In addition, manufacturing costs are low because a light emitting diode can be manufactured through one time of epitaxial growth. Moreover, processing of the recesses and projections of the substrate is easy, and the processing accuracy thereof is high.

Typically, during the growth of the first nitride III-V compound semiconductor layers, dislocations are generated from the interfaces with the bottom faces of the recesses of the substrate in the direction perpendicular to one major face of the substrate. When these dislocations reach the slopes or the vicinities thereof of the first nitride III-V compound semiconductor layers that each have a sectional shape of a triangle, the dislocations bend to a direction parallel to the one major face in such a manner as to move away from the triangle parts. The term "triangle" of "sectional shape of a triangle" and "triangle part" encompasses not only exact triangles but also shapes that can be regarded as a triangle approximately, such as a triangle-like shape of which peak is rounded off (the same hereinafter). Furthermore, preferably, plural small nuclei are generated on the bottom faces of the recesses of the substrate at the initial growth stage of the first nitride III-V compound semiconductor layers. Through processes of growth and coalescence of these small nuclei, dislocations generated from the interfaces with the bottom faces of the recesses of the substrate in the direction perpendicular to one major face of the substrate repeatedly bend to a direction parallel to the one major face. This can decrease the number of dislocations that propagate upward during the growth of the first nitride III-V compound semiconductor layers.

Typically, the projections and recesses are cyclically formed on one major face of the substrate. The cycle of the projections and recesses is preferably 3 to 5 µm. The ratio of the length of the bottom faces of the projections to that of the bottom faces of the recesses is preferably 0.5 to 3, and the most preferably about 0.5. The height of the projections from the one major face of the substrate is preferably at least 0.3 µm, and more preferably at least 1 µm. Preferably, the projections have side faces inclined relative to the one major face of the substrate (e.g., side faces in contact with the one major face of the substrate). When the angle made by the side faces and the one major face of the substrate is defined as $\theta$, in terms of an improvement in the light extraction efficiency, the angle $\theta$ is preferably in the range of $100°<\theta<160°$, more preferably in the range of $132°<\theta<139°$ or $147°<\theta<154°$, and the most preferably $135°$ or $152°$. The sectional shape of the projections may be any shape, and the side faces thereof may have not a flat surface but a curved surface. Examples of the sectional shape are as follows: n-gon shapes (n is an integer larger than two) typified by triangles, rectangles, pentagons, hexagons, and so on; shapes obtained by truncating or rounding off corners of these n-gon shapes; circles, ellipses, and so on. Of these shapes, a shape that has one peak at the highest position thereof from the one major face of the substrate is desirable. In particular, a triangle or a shape obtained by truncating or rounding off the peak of a triangle is the most desirable. The sectional shape of the recesses may also be any shape. Examples of the sectional shape are as follows: n-gon shapes (n is an integer larger than two) typified by triangles, rectangles, pentagons, hexagons, and so on; shapes obtained by truncating or rounding off corners of these n-gon shapes;

circles, ellipses, and so on. In terms of an improvement in the light extraction efficiency, the sectional shape of the recesses is preferably set to an inverted trapezoid. The term "inverted trapezoid" encompasses not only exact inverted trapezoids but also shapes that can be regarded as an inverted trapezoid approximately (the same hereinafter). In terms of minimization of the dislocation density in the second nitride III-V compound semiconductor layer, preferably, the parameters d, $W_g$ and α are defined to satisfy the inequality $2d \geqq W_g \cdot \tan \alpha$, where d is the depth of the recesses (height of the projections), $W_g$ is the width of the bottom faces of the recesses, and α is the angle made by the one major face of the substrate and the slopes of the first nitride III-V compound semiconductor layers that each have a sectional shape of a triangle. Because the angle α is constant in general, the parameters d and $W_g$ are defined to satisfy the inequality. If the depth d is too large, the source gases are not supplied to the insides of the recesses sufficiently, which poses a problem for the growth of the first nitride III-V compound semiconductor layers from the bottom faces of the recesses. In contrast, if the depth d is too small, the first nitride III-V compound semiconductor layers are problematically grown not only in the recesses of the substrate but also on the projections on both the sides of the recesses. In terms of prevention of these problems, the depth d is generally in the range of $0.5 \mu m < d < 5 \mu m$, and typically in the range of $1.0 \pm 0.2 \mu m$. The width $W_g$ is generally 0.5 to 5 μm, and typically in the range of $2 \pm 0.5 \mu m$. When the width of the upper faces of the projections is defined as $W_t$, which is 0 when the sectional shape of the projections is a triangle, a larger width $W_t$ allows low-dislocation-density part to have a larger area when the sectional shape of the projections is a trapezoid. This is because the projections are regions used for the lateral growth of the second nitride III-V compound semiconductor layer. When the sectional shape of the projections is a trapezoidal, the width $W_t$ is generally 1 to 1000 μm, and typically in the range of $4 \pm 2 \mu m$.

The projections and recesses may extend in a stripe manner in one direction on the substrate for example. Alternatively, they may extend in a stripe manner in at least a first direction and a second direction that intersect with each other. For example, they may extend in a stripe manner in a first direction, second direction, and third direction that intersect with each other. The planer shape of the projections and recesses may have any of the following two-dimensional patterns: n-gon shapes (n is an integer larger than two) typified by triangles, rectangles, pentagons, hexagons, and so on; shapes obtained by truncating or rounding off corners of these n-gon shapes; circles, ellipses, dots, and so on. Examples of the three-dimensional shape of the projections are as follows: n-gonal pyramids (n is an integer larger than two) typified by triangular pyramids, rectangular pyramids, pentagonal pyramids, hexagonal pyramids, and so on; shapes obtained by truncating or rounding off corners of these n-gonal pyramids; circular cones, elliptic cones, and so on.

The projections may be composed of any material, and the material may have electrical conductivity or not. Examples of the material include dielectric substances such as oxides, nitrides and carbides, and electrically conductive substances such as metals, alloys, and transparent conductive substances. Examples of the oxides include a silicon oxide ($SiO_x$), titanium oxide ($TiO_x$), tantalum oxide ($TaO_x$), hafnium oxide ($HfO_x$), zirconium oxide ($ZrO_x$), zinc oxide ($ZnO_x$), aluminum oxide ($AlO_x$), gallium oxide ($GaO_x$), magnesium oxide ($MgO_x$), barium oxide ($BaO_x$), indium oxide ($InO_x$), $MgIn_2O_4$, fluorine-doped tin oxide ($SnO_2$: F(FTO)), tin oxide ($SnO_x$), lithium oxide ($LiO_x$), calcium oxide ($CaO_x$), copper oxide ($CuO_x$), $CuAlO_2$, $SrCu_2O_2$, iridium oxide ($IrO_x$), ruthenium oxide ($RuO_x$), $Cu_a(Al_xGa_yIn_z)_{1-a}O_2$, CdGeO, InGaZnO, ZnRhO, $GaIn_2O_4$, LaO, and LaCuO. A mixture or multilayer film of these substances may also be used. Examples of the nitrides include a silicon nitride ($SiN_x$), TiN, WN, CN, BN, LiN, TiON, and SiON. A mixture or multilayer film of these substances may also be used. Examples of the carbides include SiC, HfC, ZrC, WC, and TiC. A mixture or multilayer film of these substances may also be used. Examples of the metals and alloys include B, Al, Ga, In, W, Ni, Co, Pd, Pt, Ag, Hf, Zr, Au, Cu, Ru, Ir, AgNi, AgPd, AuNi, AuPd, AlCu, AlSi, and AlSiCu. A mixture or multilayer film of these substances may also be used. Examples of the transparent conductive substances include an indium-tin oxide (ITO), indium-zinc oxide (IZO), zinc oxide (ZO), FTO, and tin oxide. A mixture or multilayer film of these substances may also be used. Furthermore, a mixture or multilayer film of two or more kinds of the above-listed various materials may also be used. In addition, projections formed of a metal or the like and having a surface that has been subjected to nitridation, oxidation, or carbonization so that a nitride, oxide or carbide is formed thereon are also available.

The refractive index of the projections is determined based on design depending on need. In general, the refractive index of the projections is defined so as to be different from that of the substrate and those of the nitride III-V compound semiconductor layers to be grown over the substrate. Typically, it is defined so as to be smaller than the refractive index of the substrate.

Scattering centers may be introduced in the projections according to need, for the purpose of scattering light emitted from the active layer to thereby enhance the light extraction efficiency and achieve a higher output from the light emitting diode. As the scattering centers, e.g. silicon fine particles such as silicon nanocrystals can be used. For formation of the projections in which the silicon fine particles are introduced, e.g. a method of forming the projections on the substrate by use of a silicon oxide and then subjecting the projections to heat treatment is available.

In order to grow the first nitride III-V compound semiconductor layers only in the recesses of the substrate, at least the surfaces of the projections may be formed of an amorphous layer for example. This amorphous layer serves as a growth mask. This is based on a characteristic that an amorphous layer shows a reduced tendency of occurrence of nucleation thereon during layer growth. The amorphous layer may be deposited on the substrate by any of various film deposition methods, or may be formed by forming the projections by use of a metal or the like and oxidizing the surfaces of the projections. The amorphous layer is formed of e.g. an $SiO_x$ film, $SiN_x$ film, amorphous Si (a-Si) film, or multilayer film of two or more kinds of these films. In general, the amorphous layer is formed of an insulating film. Depending on the case, the projections may be formed of a first amorphous layer, second amorphous layer, and third amorphous layer formed over the substrate. In this case, the second amorphous layer may be composed of a material that can be etched selectively with respect to those of the first and third amorphous layers for example.

The following manufacturing method is also available. Specifically, after the second nitride III-V compound semiconductor layer has been laterally grown, at least part of portions above the projections and/or portions above the recesses is removed from the first and second nitride III-V compound semiconductor layers. Subsequently, the third nitride III-V compound semiconductor layer is laterally grown on the remaining second nitride III-V compound semiconductor layer, followed by sequential growth of the active layer and the fourth nitride III-V compound semiconductor layer over the third nitride III-V compound semiconductor layer. In addition, the following manufacturing method is also available. Specifically, after the second nitride III-V compound semiconductor layer has been laterally grown, at least part of portions above the projections and/or portions above the recesses is removed from the first and second nitride III-V compound semiconductor layers. Subsequently, a sixth nitride III-V compound semiconductor layer is laterally grown on the remaining second nitride III-V compound semiconductor layer, followed by sequential growth of the third nitride III-V compound semiconductor layer, the active layer, and the fourth nitride III-V compound semiconductor layer over the sixth nitride III-V compound semiconductor layer.

Threading dislocations concentrate in the meet parts between the second nitride III-V compound semiconductor layers above the projections. Therefore, by forming dislocation propagation inhibitors formed of an insulator, gap, or the like in advance in the parts to become the meet parts above the projections so that the dislocation propagation inhibitors inhibit dislocations that propagate in the second nitride III-V compound semiconductor layers in a direction parallel to the one major face of the substrate, it can be prevented that dislocations reach the surfaces of the second nitride III-V compound semiconductor layers and thus become threading dislocations.

On the third nitride III-V compound semiconductor layer, the first electrode is formed with being electrically coupled to the third nitride III-V compound semiconductor layer. Similarly, on the fourth nitride III-V compound semiconductor layer, the second electrode is formed with being electrically coupled to the fourth nitride III-V compound semiconductor layer.

As the substrate, any of various substances can be used. As the substrate composed of a material different from a nitride III-V compound semiconductor, a substrate composed of any of the following materials can be used for example: sapphire (including the c-plane, a-plane, r-plane, and so forth, and including also a plane offset from these planes), SiC (including 6H, 4H, and 3C), Si, ZnS, ZnO, LiMgO, GaAs, spinel ($MgAl_2O_4$, $ScAlMgO_4$), and garnet. Preferably, a hexagonal substrate or cubic substrate composed of any of these materials is used, and a hexagonal substrate is used more preferably. A substrate composed of a nitride III-V compound semiconductor (GaN, AlGaInN, AlN, GaInN, or the like) may be used as the substrate. Alternatively, as the substrate, a structure is also available that is obtained by growing a nitride III-V compound semiconductor layer on a substrate composed of a material different from a nitride III-V compound semiconductor, and forming the projections on the nitride III-V compound semiconductor layer.

If a structure obtained by growing a layer such as a nitride III-V compound semiconductor layer on a substrate is used as the substrate for example, a substance different from the material of the layer directly beneath the projections is used as the material of the projections.

The substrate may be removed according to need.

The nitride III-V compound semiconductor layer that forms the first to sixth nitride III-V compound semiconductor layers and the active layer is composed of, the most generally $Al_xB_yGa_{1-x-y-z}In_zAs_uN_{1-u-v}P_v$ ($0 \leq x \leq 1$, $0 \leq y \leq 1$, $0 \leq z \leq 1$, $0 \leq u \leq 1$, $0 \leq v \leq 1$, $0 \leq x+y+z<1$, $0 \leq u+v<1$), more specifically $Al_xB_yGa_{1-x-y-z}In_zN$ ($0 \leq x \leq 1$, $0 \leq y \leq 1$, $0 \leq z \leq 1$, $0 \leq x+y+z<1$), and typically $Al_xGa_{1-x-z}In_zN$ ($0 \leq x \leq 1$, $0 \leq z \leq 1$). Specific examples of the material include GaN, InN, AlN, AlGaN, InGaN, and AlGaInN. In particular, the first nitride III-V compound semiconductor layers, which are first grown in the recesses of the substrate, are preferably composed of GaN, $In_xGa_{1-x}N$ ($0 \leq x \leq 0.5$), $Al_xGa_{1-x}N$ ($0<x<0.5$), or $Al_xIn_yGa_{1-x-y}N$ ($0<x<0.5$, $0<y<0.2$).

The thickness of the second nitride III-V compound semiconductor layer is selected depending on need, and typically about several micrometers or less. However, the thickness may be larger depending on use, e.g., several tens of micrometers to about three hundred micrometers (10 to 300 μm).

As the method for growing the nitride III-V compound semiconductor layer that forms the first to sixth nitride III-V compound semiconductor layers and the active layer, an epitaxial growth method such as metal organic chemical vapor deposition, molecular beam epitaxy, hydride vapor phase epitaxy (HVPE), or halide vapor phase epitaxy.

According to a third embodiment of the present invention, there is provided an integrated light emitting diode in which a plurality of light emitting diodes are integrated. At least one of the light emitting diodes includes a first semiconductor layer of a first conductivity type, an active layer on the first semiconductor layer, a second semiconductor layer of a second conductivity type on the active layer, a first electrode configured to be electrically coupled to the first semiconductor layer, and a second electrode configured to be provided on the second semiconductor layer and be electrically coupled to the second semiconductor layer. The second electrode includes a first metal film that has a predetermined shape and is composed mainly of silver and a second metal film that covers the first metal film and is composed mainly of palladium and/or platinum.

According to a fourth embodiment of the present invention, there is provided a method for manufacturing an integrated light emitting diode in which a plurality of light emitting diodes are integrated. The method includes the steps of sequentially growing a first semiconductor layer of a first conductivity type, an active layer, and a second semiconductor layer of a second conductivity type over a substrate, forming a first electrode electrically coupled to the first semiconductor layer, and forming a first metal film that has a predetermined shape and is composed mainly of silver on the second semiconductor layer, and forming a second metal film that covers the first metal film and is composed mainly of palladium and/or platinum, to thereby form a second electrode electrically coupled to the second semiconductor layer.

The integrated light emitting diode of the third and fourth embodiments may be applied to any application. Typical examples of the application include a light emitting diode backlight used for a liquid crystal display and so on, light emitting diode illumination device, light emitting diode display, light emitting diode optical communication device (e.g., visible light communication device), and light emitting diode spatial light transmission device. There is no limitation on the manner of the arrangement and shape of light emitting diodes in the integrated light emitting diode. For example, light emitting diodes may be arranged in a two-dimensional array. Alternatively, stripe light emitting diodes may be arranged on one or plural columns.

Features relating to the third and fourth embodiments other then the above description are similar to the above-described features relating to the first and second embodiments, as long as the features of the first and second embodiments do not contradict the characteristics of the third and fourth embodiments.

According to a fifth embodiment of the present invention, there is provided a light emitting diode backlight in which a plurality of red light emitting diodes, a plurality of green light emitting diodes, and a plurality of blue light emitting diodes are arranged. At least one light emitting diode of the green light emitting diodes and the blue light emitting diodes includes a first semiconductor layer of a first conductivity type, an active layer on the first semiconductor layer, a second semiconductor layer of a second conductivity type on the active layer, a first electrode configured to be electrically coupled to the first semiconductor layer, and a second electrode configured to be provided on the second semiconductor layer and be electrically coupled to the second semiconductor layer. The second electrode includes a first metal film that has a predetermined shape and is composed mainly of silver and a second metal film that covers the first metal film and is composed mainly of palladium and/or platinum.

According to a sixth embodiment of the present invention, there is provided a light emitting diode illumination device in which a plurality of red light emitting diodes, a plurality of green light emitting diodes, and a plurality of blue light emitting diodes are arranged. At least one light emitting diode of the green light emitting diodes and the blue light emitting diodes includes a first semiconductor layer of a first conductivity type, an active layer on the first semiconductor layer, a second semiconductor layer of a second conductivity type on the active layer, a first electrode configured to be electrically coupled to the first semiconductor layer, and a second electrode configured to be provided on the second semiconductor layer and be electrically coupled to the second semiconductor layer. The second electrode includes a first metal film that has a predetermined shape and is composed mainly of silver and a second metal film that covers the first metal film and is composed mainly of palladium and/or platinum.

According to a seventh embodiment of the present invention, there is provided a light emitting diode display in which a plurality of red light emitting diodes, a plurality of green light emitting diodes, and a plurality of blue light emitting diodes are arranged. At least one light emitting diode of the green light emitting diodes and the blue light emitting diodes includes a first semiconductor layer of a first conductivity type, an active layer on the first semiconductor layer, a second semiconductor layer of a second conductivity type on the active layer, a first electrode configured to be electrically coupled to the first semiconductor layer, and a second electrode configured to be provided on the second semiconductor layer and be electrically coupled to the second semiconductor layer. The second electrode includes a first metal film that has a predetermined shape and is composed mainly of silver and a second metal film that covers the first metal film and is composed mainly of palladium and/or platinum.

According to an eighth embodiment of the present invention, there is provided an electronic apparatus including one or a plurality of light emitting diodes. At least one of the light emitting diodes includes a first semiconductor layer of a first conductivity type, an active layer on the first semiconductor layer, a second semiconductor layer of a second conductivity type on the active layer, a first electrode configured to be electrically coupled to the first semiconductor layer, and a second electrode configured to be provided on the second semiconductor layer and be electrically coupled to the second semiconductor layer. The second electrode includes a first metal film that has a predetermined shape and is composed mainly of silver and a second metal film that covers the first metal film and is composed mainly of palladium and/or platinum.

The electronic apparatus of the eighth embodiment encompasses a light emitting diode backlight, light emitting diode illumination device, light emitting diode display, projector that employs a light emitting diode as its light source, rear-projection television, grating light valve (GLV), and so on. In general, the electronic apparatus may be any apparatus basically as long as it includes at least one light emitting diode for the purpose of displaying, illumination, optical communication, optical transmission, or another use. The electronic apparatus encompasses both portable and stationary apparatuses. Specific examples of the electronic apparatus other than the above-listed apparatuses include cell phones, mobile apparatuses, robots, personal computers, vehicle apparatuses, various home electric appliances, light emitting diode optical communication devices, and light emitting diode optical transmission devices. Furthermore, the electronic apparatus encompasses also an entity obtained by combining two or more kinds of light emitting diodes that emit light in different wavelength bands of the far-infrared wavelength band, infrared wavelength band, red wavelength band, yellow wavelength band, green wavelength band, blue wavelength band, violet wavelength band, ultraviolet wavelength band, and so forth. In a light emitting diode illumination device in particular, two or more kinds of light emitting diodes may be combined that emit visible light in different wavelength bands of the red wavelength band, yellow wavelength band, green wavelength band, blue wavelength band, violet wavelength band, and so forth, so that natural light or white light can be obtained by mixing two or more kinds of light rays emitted from these light emitting diodes. Alternatively, a light emitting diode that emits light in at least one wavelength band of the blue wavelength band, violet wavelength band, ultraviolet wavelength band, and so forth may be used as a light source, so that natural light or white light can be obtained by mixing light arising from irradiation of a fluorescent substance with the light emitted from the light emitting diode for excitation thereof.

According to a ninth embodiment of the present invention, there is provided an electronic device that includes an electrode configured to be provided over an underlying base and include a first metal film that has a predetermined shape and is composed mainly of silver and a second metal film that covers the first metal film and is composed mainly of palladium and/or platinum.

According to a tenth embodiment of the present invention, there is provided a method for manufacturing an electronic device. The method includes the step of forming a first metal film that has a predetermined shape and is composed mainly of silver over an underlying base, and forming a second metal film that covers the first metal film and is composed mainly of palladium and/or platinum, to thereby form an electrode.

In the ninth and tenth embodiments, the underlying base may be composed of any substance basically. Specific examples of the underlying base include a semiconductor layer, semiconductor substrate, conductive oxide layer, and conductive oxide substrate. Specific examples of the electronic device include a semiconductor device, piezoelectric device, pyroelectric device, optical device (e.g., second harmonic generating element employing a nonlinear optical crystal), dielectric device (including a ferroelectric device), and superconductive device. The semiconductor device encompasses light-emitting elements such as general light emitting diodes, intersubband transition (quantum cascade) light emitting diodes, general semiconductor lasers, and intersubband transition (quantum cascade) semiconductor lasers. Furthermore, the semiconductor device encompasses also light-receiving elements such as photodiodes, sensors, solar cells, and electron transit elements typified by transistors. Examples of the transistors include field effect transistors (FETs) such as high electron mobility transistors, and bipolar transistors such as hetero-junction bipolar transistors (HBTs). One or a plurality of these elements are formed on the same substrate or chip. These elements are configured to be independently driven according to need. Integrating light-emitting elements and electron transit elements on the same substrate allows construction of an optoelectronic integrated circuit (OEIC). Optical interconnects may be provided according to need. Illumination communication or optical communication based on light supply can also be implemented by use of the blinking of at least one light-emitting element (light emitting diode or semiconductor laser). The illumination communication or optical communication may be implemented by use of plural light rays in different wavelength bands. By employing a device including light emitting diodes or semiconductor lasers as the electronic device, the following electronic apparatuses can be formed: light emitting diode backlights, light emitting diode illumination devices, and light emitting diode displays. Furthermore, projectors and rear-projection televisions that employ light emitting diodes or semiconductor lasers as a light source, grating light valves, and other apparatuses can also be formed.

Also for the ninth and tenth embodiments, applications similar to those of the first to eighth embodiments are possible.

Features relating to the ninth and tenth embodiments other then the above description are similar to the above-described features relating to the first to eighth embodiments, as long as the features of the first to eighth embodiments do not contradict the characteristics of the ninth and tenth embodiments.

In the embodiments having the above-described configurations, the first metal film composed mainly of silver is covered by the second metal film composed mainly of palladium and/or platinum, which can substantially completely prevent the migration of silver not only at room temperatures but also at high temperatures (e.g., 300° C. or higher). This can prevent the occurrence of voids (gaps arising from movement out of silver) and whiskers, which cause deterioration of the reliability of the electrode. Furthermore, oxidation and sulfuration of the first metal film can also be effectively prevented. In addition, even if a layer containing a metal that easily diffuses such as tin or gold is formed above the second metal film, reaction between the layer and the first metal film through silver migration can be prevented.

According to the embodiments of the present invention, deterioration of the first metal film due to silver migration can be prevented, which allows the first metal film to maintain its high reflectivity and low electric resistivity for a long period. Thus, a stable and high-performance electrode having excellent environmental resistance can be achieved. Therefore, light emitted from an active layer can be reflected by the electrode with high efficiency so as to be extracted to the external. Accordingly, a high-performance light emitting diode having high light emission efficiency, a long life, and high reliability can be realized. In addition, using this light emitting diode with high emission efficiency allows realization of a high-performance light emitting diode backlight, light emitting diode illumination device, light emitting diode display, light emitting diode optical communication device, spatial light transmission device, various electronic apparatuses, and so forth.

The above and other features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 18A to 18F are schematic diagrams showing the manner of growth of nitride III-V compound semiconductor layers on a substrate in the method for manufacturing a light emitting diode according to the sixth embodiment of the present invention;

DETAILED DESCRIPTION OF THE PREFERRED EMBODIMENTS

Embodiments of the present invention will be described below with reference to the accompanying drawings. In all the drawings for the embodiments, the same and equivalent parts are given the same numerals.

Figure 1A:
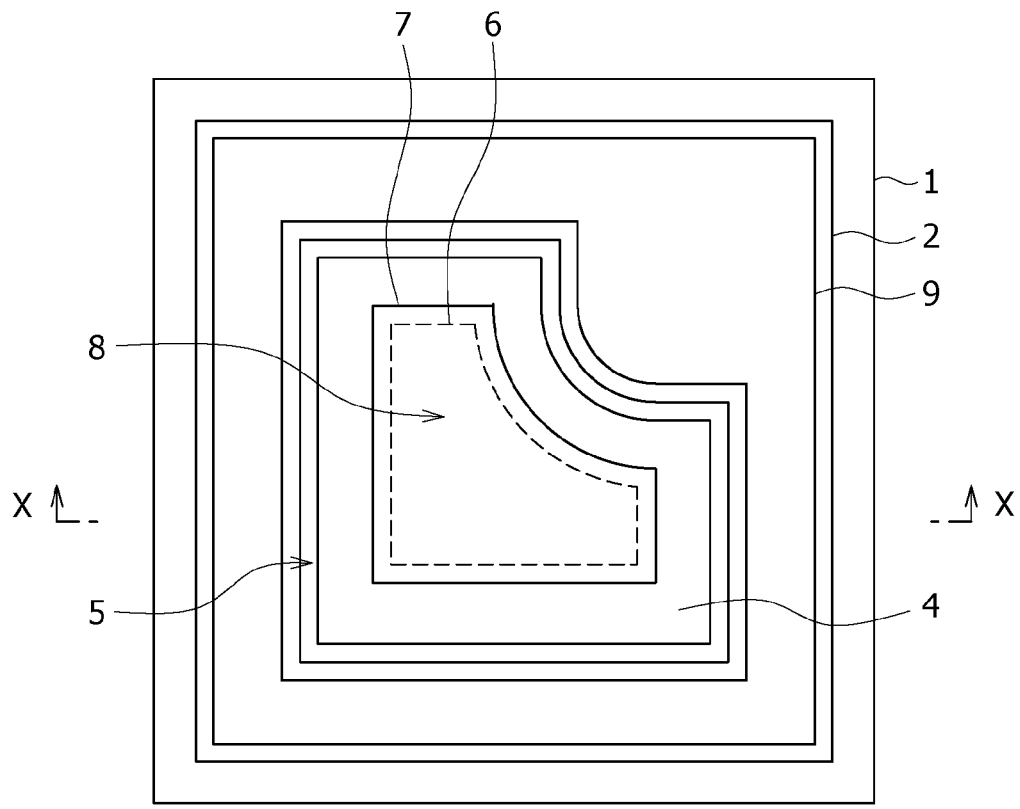
FIGS. 1A and 1B are a plan view and sectional view, respectively, showing a light emitting diode according to a first embodiment of the present invention.
Figure 1B:
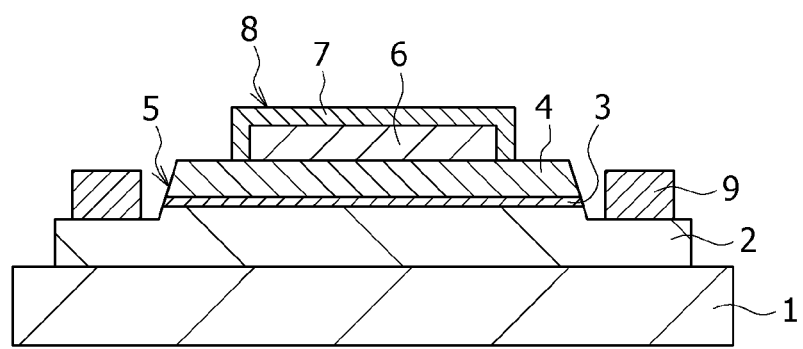

FIGS. 1A and 1B show a light emitting diode according to a first embodiment of the present invention. FIG. 1A is a plan view, and FIG. 1B is a sectional view along line X-X in FIG. 1A. This light emitting diode employs a nitride III-V compound semiconductor such as GaN.

As shown in FIGS. 1A and 1B, in the light emitting diode, an n-type nitride III-V compound semiconductor layer 2, an active layer 3 formed of a nitride III-V compound semiconductor, and a p-type nitride III-V compound semiconductor layer 4 are sequentially deposited over a substrate 1 that has one flat major face and is composed of a material transmissive for light of the emission wavelength. Any of the above-described materials can be used for the substrate 1 for example. Specifically, the substrate 1 is e.g. a sapphire substrate and the major face thereof is e.g. the c-plane. Upper part of the n-type nitride III-V compound semiconductor layer 2, the active layer 3, and the p-type nitride III-V compound semiconductor layer 4 form a mesa portion 5 having a predetermined planar shape and sectional shape. On the p-type nitride III-V compound semiconductor layer 4 of the mesa portion 5, a first metal film 6 composed mainly of Ag and having a predetermined planar shape is provided and forms an ohmic contact to the p-type nitride III-V compound semiconductor layer 4. Furthermore, a second metal film 7 composed mainly of Pd and/or Pt is formed to cover the first metal film 6, so that a p-electrode 8 is formed by these first and second metal films 6 and 7. The compositions of the first and second metal films 6 and 7 are as described above. The thickness of the first metal film 6 is e.g. 30 to 200 nm (e.g., 140 nm). The thickness of the second metal film 7 is e.g. 10 to 150 nm (e.g., 100 nm). On the n-type nitride III-V compound semiconductor layer 2 outside the mesa portion 5, an n-electrode 9 is formed to surround the mesa portion 5 and forms an ohmic contact to the layer n-type nitride III-V compound semiconductor 2.

A method for manufacturing the light emitting diode will be described below.

Figure 2A:
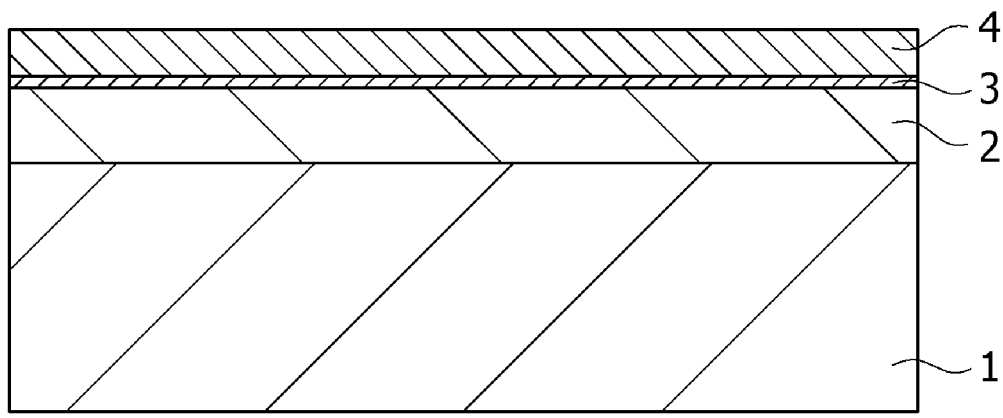
FIGS. 2A and 2D are sectional views for explaining a method for manufacturing the light emitting diode according to the first embodiment of the present invention.

Initially, the substrate 1 is prepared and the surface thereof is cleaned by thermal cleaning or the like. Thereafter, e.g. a GaN buffer layer or AlN buffer layer (not shown) is grown on the substrate 1 by a known method and at a growth temperature of e.g. about 550° C. Subsequently, as shown in FIG. 2A, the n-type nitride III-V compound semiconductor layer 2, the active layer 3 formed of a nitride III-V compound semiconductor, and the p-type nitride III-V compound semiconductor layer 4 are sequentially epitaxially grown by e.g. MOCVD.

Examples of growth sources for the nitride III-V compound semiconductor layers are as follows: triethylgallium $((C_2H_5)_3Ga$, TEG) or trimethylgallium $((CH_3)_3Ga$, TMG) as a material for Ga; trimethylaluminum $((CH_3)_3Al$, TMA) as a material for Al; trimethylindium $((C_2H_5)_3In$, TEI) or trimethylindium $((CH_3)_3In$, TMI) as a material for In; and an ammonia $(NH_3)$ as a material for N. As for dopants, e.g. silane $(SiH_4)$ is used as the n-type dopant, and e.g. bis(methylcyclopentadienyl)magnesium $((CH_3C_5H_4)_2Mg)$, bis(ethylcyclopentadienyl)magnesium $((C_2H_5C_5H_4)_2Mg)$, or bis(cyclopentadienyl)magnesium $((C_5H_5)_2Mg)$ is used as the p-type dopant. For the carrier gas atmosphere at the time of the growth of the nitride III-V compound semiconductor layers, e.g. an $H_2$ gas is used.

After the growth of the nitride III-V compound semiconductor layers, the substrate 1 over which the layers have been grown is brought out from the MOCVD apparatus.

Figure 2B:
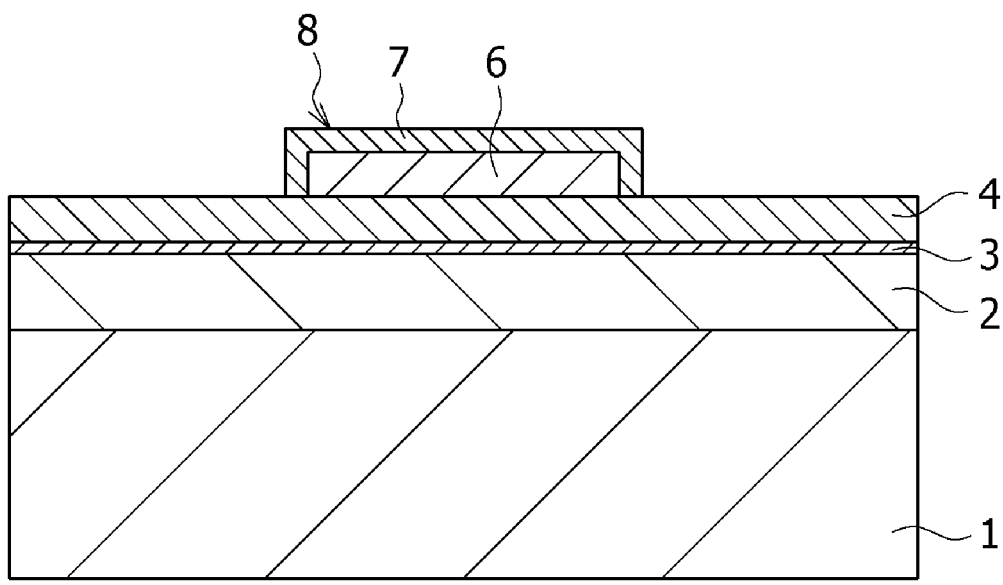

Referring next to FIG. 2B, the first metal film 6 having a predetermined shape is formed on the p-type nitride III-V compound semiconductor layer 4 by lift-off, etching or another method. In the lift off, initially a resist pattern having a predetermined shape is formed on the p-type nitride III-V compound semiconductor layer 4, and then a metal film is deposited over the entire face by sputtering or vacuum evaporation. Thereafter, the resist pattern is removed together with the metal film formed thereon, so that the first metal film 6 having a predetermined shape is formed. In the etching, initially the first metal film 6 is formed over the entire face of the p-type nitride III-V compound semiconductor layer 4, and then an etching mask such as a resist pattern is formed on the first metal film 6. Thereafter, the first metal film 6 is etched by use of the etching mask so as to be patterned into a predetermined shape. After the formation of the first metal film 6, the second metal film 7 having a predetermined shape is formed to cover the first metal film 6. This second metal film 7 having a predetermined shape can be formed through a method similar to that for the first metal film 6. In the above-described manner, the p-electrode 8 composed of the first and second metal films 6 and 7 is formed.

Subsequently, heat treatment is carried out to activate the p-type impurity in the p-type nitride III-V compound semiconductor layer 4. This heat treatment is carried out in a mixture gas atmosphere of $N_2$ and $O_2$ (e.g. 99% $N_2$ and 1% $O_2$ as the composition) at a temperature of 500 to 750° C., preferably 550 to 750° C., for e.g. one minute to two hours or five minutes to two hours. More specifically, this heat treatment is carried out at 550° C. for two minutes for example. The reason why $O_2$ is mixed with $N_2$ is because $O_2$ promotes the activation. The purpose of use of a comparatively low temperature for this heat treatment is to prevent deterioration of the active layer 3 and so on due to the heat treatment.

Figure 2C:
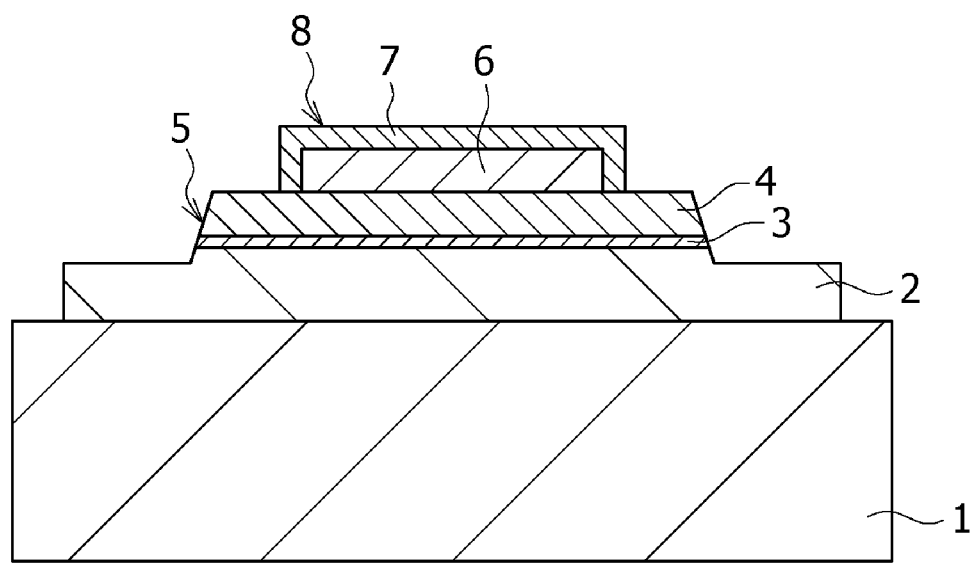

After the heat treatment, a resist pattern (not shown) that has a predetermined shape and covers the p-electrode 8 and the p-type nitride III-V compound semiconductor layer 4 around the p-electrode 8 is formed, and then etching with use of the resist pattern as the etching mask is carried out through reactive ion etching (RIE) employing e.g. a chlorine ($Cl_2$) gas. Due to this etching, upper part of the n-type nitride III-V compound semiconductor layer 2, the active layer 3, and the p-type nitride III-V compound semiconductor layer 4 are patterned to form the mesa portion 5 as shown in FIG. 2C. Thereafter, this resist pattern is removed.

Figure 2D:
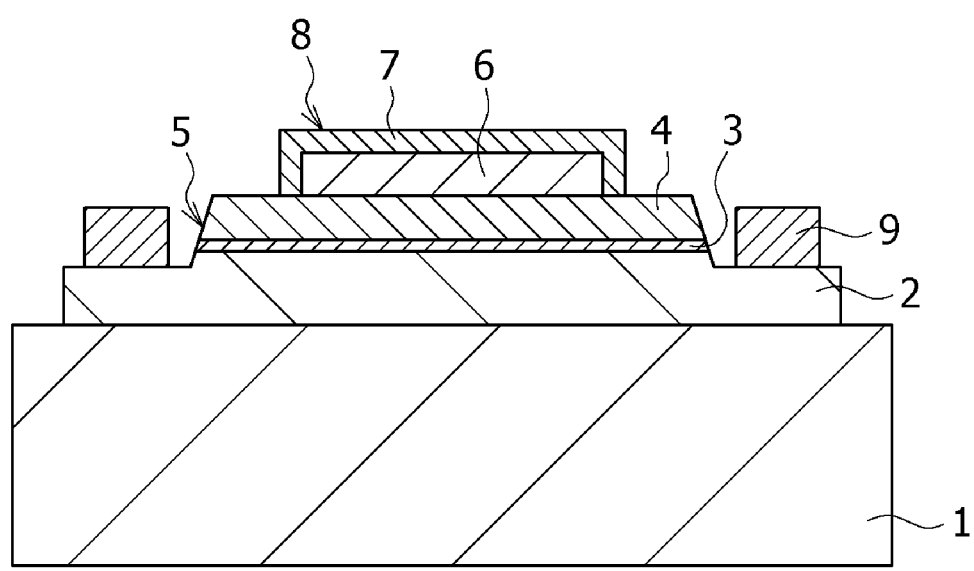

Referring next to FIG. 2D, the n-electrode 9 is formed by lift-off or etching on the n-type nitride III-V compound semiconductor layer 2 adjacent to the mesa portion 5.

After the formation of the n-electrode 9, the n-type nitride III-V compound semiconductor layer 2 on the part to serve as a scribe region is etched to thereby expose the substrate 1.

Subsequently, the substrate 1 on which the light emitting diode structure has been formed in the above-described manner is subjected to grinding and lapping from the backside thereof so that the thickness thereof is decreased according to need, and then scribing (dicing) of the substrate 1 is carried out to form bars. Thereafter, the bars are subjected to scribing so as to be divided into chips.

Through the above-described steps, the intended light emitting diode is fabricated.

A specific structural example of the light emitting diode will be described. Specifically, for example, the n-type nitride III-V compound semiconductor layer 2 is composed of an n-type GaN layer, n-type GaInN layer, n-type GaN layer, and n-type GaInN layer in that order from the bottom. The upper two layers are contained in the mesa portion 5, and the n-electrode 9 is formed on the lower n-type GaInN layer. The p-type nitride III-V compound semiconductor layer 4 is composed of a p-type GaInN layer, p-type AlInN layer, p-type GaN layer, and p-type GaInN layer in that order from the bottom. The active layer 3 has e.g. a GaInN-based multiple quantum well (MQW) structure (e.g. a multilayer structure of alternate GaInN quantum well layers and GaN barrier layers). The In content in the active layer 3 is selected depending on the emission wavelength of the light emitting diode. For example, the In content is at most 11% for an emission wavelength of 405 nm, at most 18% for 450 nm, and at most 24% for 520 nm. As the first metal film 6 of the p-electrode 8, e.g. an Ag—Pd—Cu alloy film (the Pd content is 0.5 to 4.9 atomic %, and the Cu content is 0.1 to 3.5 atomic %) or Ag film formed by sputtering and having a thickness of 140 nm is used. As the second metal film 7, e.g. a Pd film formed by sputtering and having a thickness of 120 nm is used. The linear expansion coefficients of Ag and Pd are almost equal to each other: $19 \times 10^{-6}$/K and $11 \times 10^{-6}$/K, respectively. Therefore, even when the temperature changes, distortion due to a thermal stress hardly occurs between the first and second metal films 6 and 7. As the n-electrode 9, e.g. a Ti/Ni/Au/Ni structure is used (the thicknesses of the Ti film, Ni film, Au film, and Ni film are 10 nm, 50 nm, 180 nm, and 10 nm, respectively for example).

In this light emitting diode, light emission from the active layer 3 is obtained by applying a forward voltage between the p-electrode 8 and the n-electrode 9 to thereby apply a current therebetween. The emitted light is extracted to the external through the substrate 1. Depending on selection of the In content in the active layer 3, green or blue light emission can be obtained. Of the light emitted from the active layer 3, light directed toward the substrate 1 is refracted at the interface between the substrate 1 and the n-type nitride III-V compound semiconductor layer 2, and then passes through the substrate 1 to the external. In contrast, light emitted from the active layer 3 and directed toward the p-electrode 8 is reflected by the first metal film 6 composed mainly of Ag as a high reflectivity material in the p-electrode 8 so as to be directed toward the substrate 1, and then passes through the substrate 1 to the external.

Figure 3C:
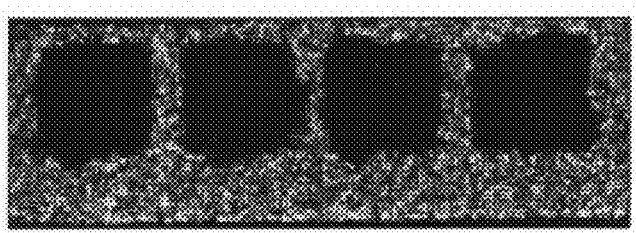
FIGS. 3A to 3C are photographs for explaining an effect of preventing Ag migration by a second metal film in the light emitting diode according to the first embodiment of the present invention.
Figure 3B:
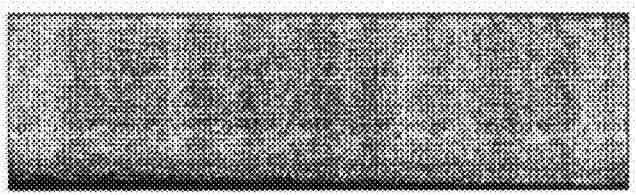
Figure 3A:
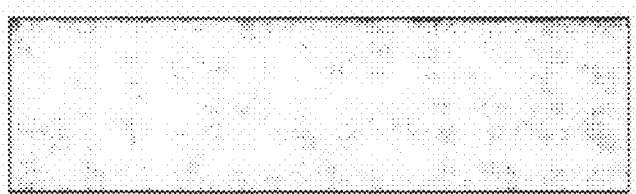

A description will be made below on the result of experiments conducted to verify the effect of prevention of Ag migration from the first metal film 6 due to the second metal film 7. FIG. 3A is an optical photomicrograph obtained as follows. Specifically, for imaging thereof, an embodiment example is prepared that employs an Ag—Pd—Cu alloy film as the first metal film 6 and a Pd film as the second metal film 7. Furthermore, the second metal film 7 is covered by a TiW film, and Sn is provided on the TiW film by soldering at 300° C. The photomicrograph is obtained by imaging the p-electrode 8 through a sapphire substrate used as the substrate 1 in the state where the active layer 3 is caused to emit light by applying a current between the p-electrode 8 and the n-electrode 9 through the solder. FIG. 3B is an optical photomicrograph obtained in a similar manner regarding a first comparative example in which an Ag—Pd—Cu alloy film is used as the first metal film 6 and a film of TiW, which is included in the metals disclosed in Patent Document 1 as the material of a protective sheet, is used as an equivalent to the second metal film 7. Note that a similar result to that shown in FIG. 3B was obtained also regarding an example in which a film of W, which is included in the metals disclosed in Patent Document 1 as the material of a protective sheet, is used as an equivalent to the second metal film 7. FIG. 3C is an optical photomicrograph obtained in a similar manner regarding a second comparative example in which an Ag—Pd—Cu alloy film is used as the first metal film 6 and a film of Ni, which is included in the metals disclosed in Patent Document 1 as the material of a protective sheet, is used as an equivalent to the second metal film 7. A comparison among FIGS. 3A to 3C shows the following facts. Specifically, in FIG. 3C, solder patterns are visible. These visible solder patterns correspond to diffusion traces indicating that the significant migration of Ag contained in the first metal film 6 through the Ni film covering the first metal film 6 has occurred and accordingly Sn of the solder has diffused into the first metal film 6. FIG. 3B also shows diffusion traces indicating the occurrence of a similar reaction, although the degree of the visibility thereof is lower compared with in FIG. 3C. In contrast, no diffusion trace is visible in FIG. 3A, which indicates that the Pd film used as the second metal film 7 prevents the migration of Ag contained in the first metal film 6. The purpose of the image capturing in the state where the active layer 3 emits light is to accentuate the diffusion traces.

Figure 4:
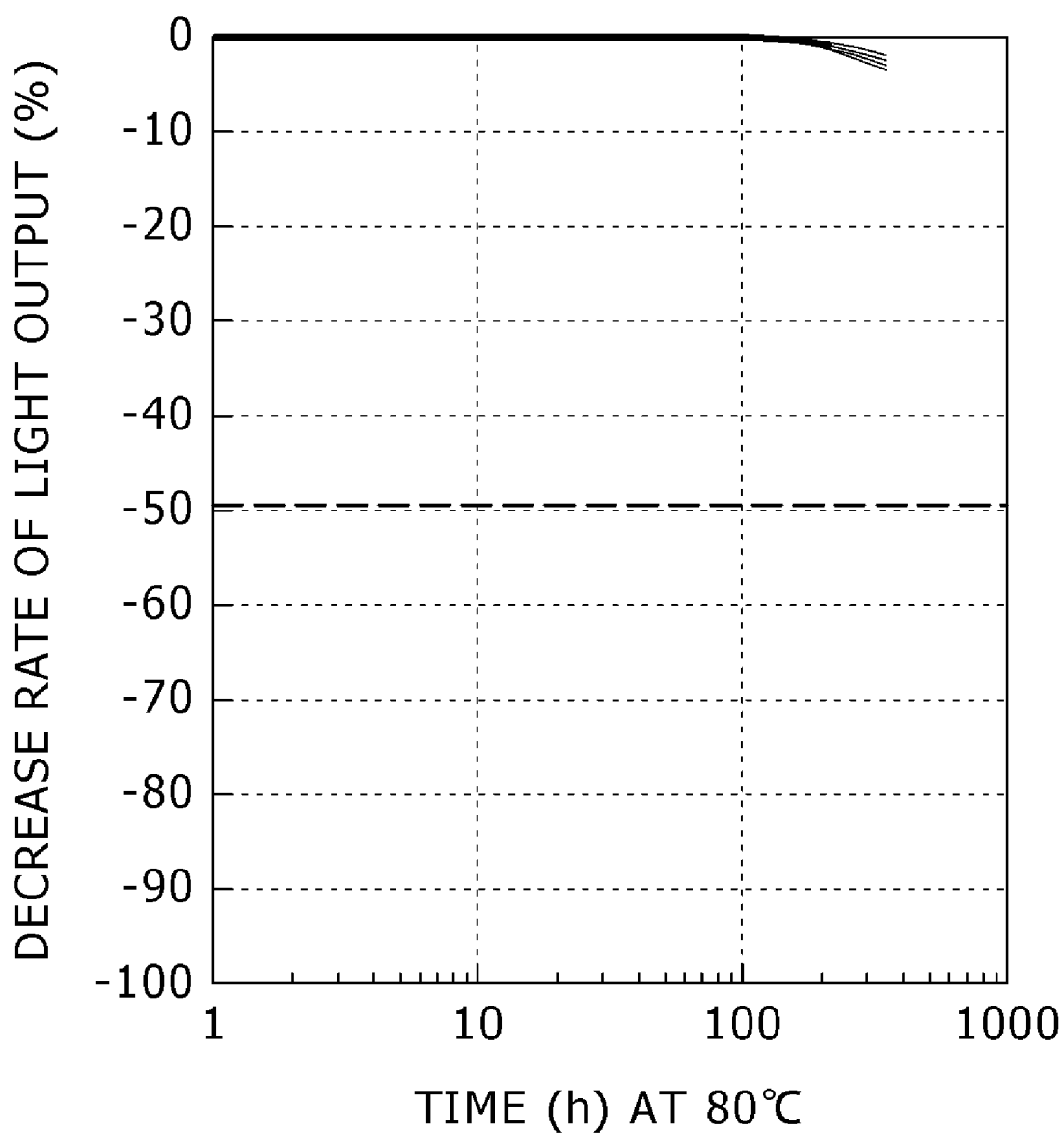
FIG. 4 is a schematic diagram showing the result of an aging test on one example of the light emitting diode according to the first embodiment of the present invention.
Figure 5:
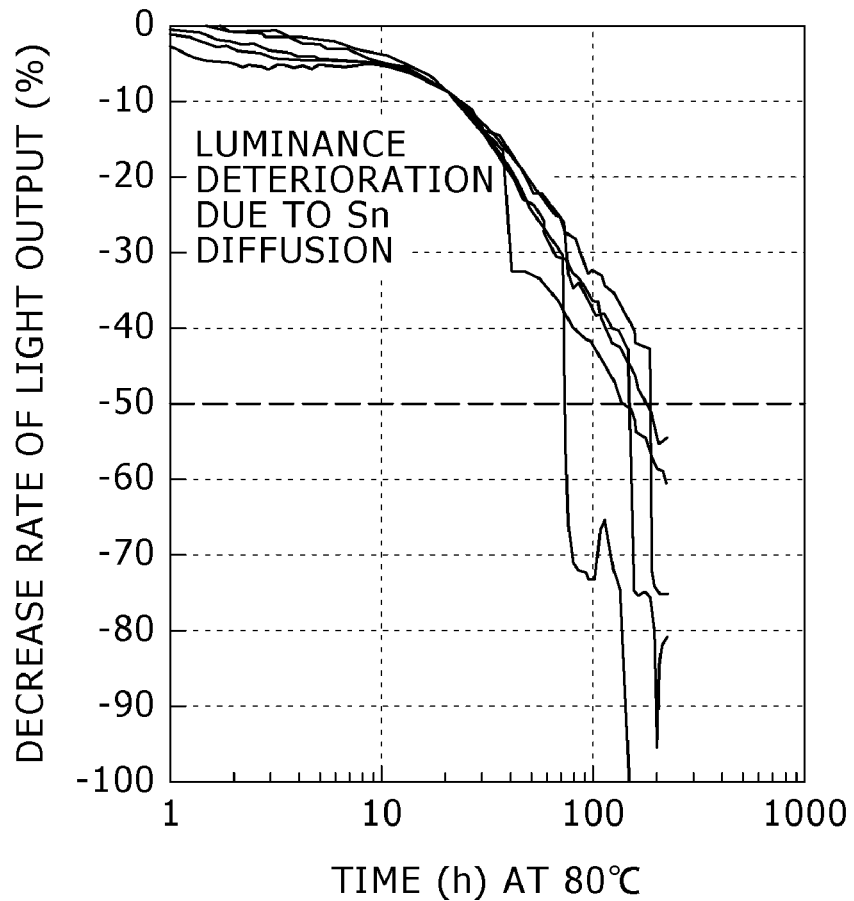
FIG. 5 is a schematic diagram showing the result of an aging test on a comparative example, carried out for comparison with the one example of the light emitting diode according to the first embodiment of the present invention.

FIG. 4 shows the result of an aging test (energization test based on rated driving at 80° C.) for a light emitting diode of the above-described embodiment. The ordinate of FIG. 4 indicates the decrease rate of light output, while the abscissa indicates the aging time. The number of tested samples is eight. As a comparison, FIG. 5 shows the result of a similar aging test for a light emitting diode in which an Ag—Pd—Cu alloy film is used as the first metal film 6 and a W film is used as an equivalent to the second metal film 7. The number of tested samples is five. FIG. 4 shows that the light emitting diode of the embodiment including a Pd film as the second metal film 7 has an estimated half-life of one hundred thousand hours or longer. In contrast, FIG. 5 shows that the estimated half-life of the light emitting diode in which an Ag—Pd—Cu alloy film is used as the first metal film 6 and a W film is used as an equivalent to the second metal film 7 is shorter than one thousand hours and hence is greatly shorter than that of the light emitting diode of the embodiment.

As described above, according to the first embodiment, the p-electrode 8 is formed of the first metal film 6 that is formed on the p-type nitride III-V compound semiconductor layer 4 and composed mainly of Ag, and the second metal film 7 that covers the first metal film 6 and is composed mainly of Pd and/or Pt. Therefore, a high reflectivity property can be achieved due to the first metal film 6. Furthermore, the second metal film 7 substantially completely prevents the migration of Ag contained in the first metal film 6 to thereby avoid deterioration, which can maintain the high reflectivity property of the first metal film 6. Thus, high-intensity green and blue light emitting diodes having a long life and high reliability can be realized.

Figure 6:
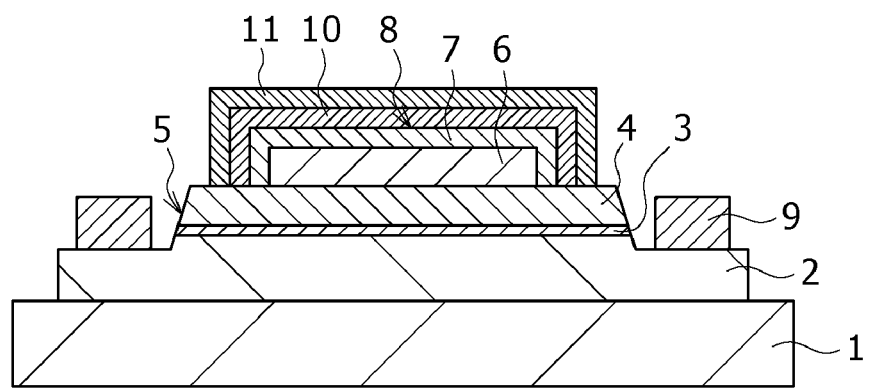
FIG. 6 is a sectional view showing a light emitting diode according to a second embodiment of the present invention.

A light emitting diode according to a second embodiment of the present invention will be described below. FIG. 6 shows this light emitting diode.

As shown in FIG. 6, in this light emitting diode, a third metal film 10 composed of W, Mo, Ti, TiW, TiMo, WMo, or TiWMo is formed to cover a p-electrode 8. Furthermore, a fourth metal film 11 composed of a metal having resistance to dry etching such as Ni is formed to cover the third metal film 10. Specifically, the third metal film 10 is e.g. a TiW film formed by sputtering and having a thickness of 120 nm, and the fourth metal film 11 is e.g. a Ni film formed by sputtering and having a thickness of 50 nm. Other components of this light emitting diode are the same as those of the light emitting diode of the first embodiment.

The manufacturing method for this light emitting diode is the same as that for the first embodiment, except that the third and fourth metal films 10 and 11 are formed subsequently to formation of the second metal film 7.

According to the second embodiment, the same advantages as those by the first embodiment can be achieved. Furthermore, the sequential formation of the third and fourth metal films 10 and 11 to cover the p-electrode 8 can offer the following advantages. Specifically, the third metal film 10 composed of W, Mo, Ti, TiW, TiMo, WMo, or TiWMo has a function to prevent diffusion of Au and Sn. Therefore, even if a layer containing Au or Sn (solder layer or the like) is formed over the p-electrode 8, the formation of the third metal film 10 to cover the p-electrode 8 can effectively prevent Au and Sn in the layer from diffusing into the p-electrode 8 and reacting therein. The reason why diffusion of Au and Sn is effectively prevented by the third metal film 10 would be because the second metal film 7 prevents the migration of Ag in the first metal film 6. In addition, because the fourth metal film 11 composed of a metal having resistance to dry etching such as Ni is formed to cover the third metal film 10, the third metal film 10 and the p-electrode 8 can be effectively prevented from being etched at the time of RIE with use of a chlorine gas to form a mesa portion 5.

Figure 7A:
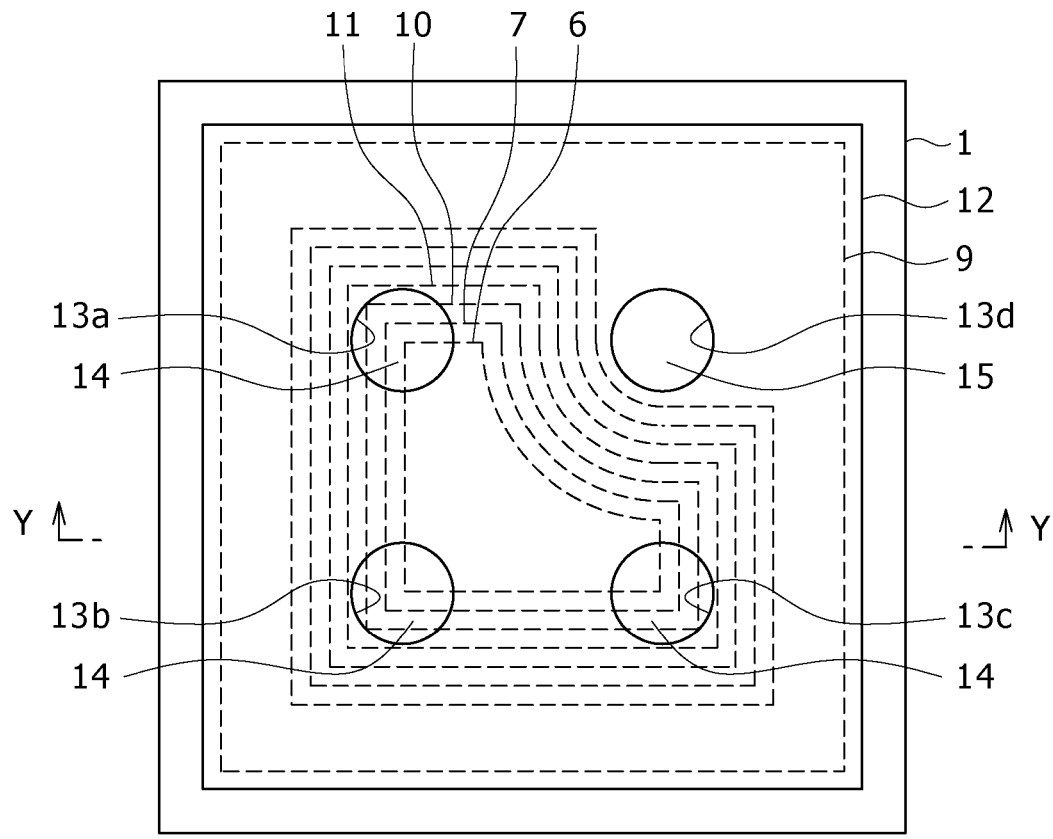
FIGS. 7A and 7B are a plan view and sectional view, respectively, showing a light emitting diode according to a third embodiment of the present invention.
Figure 7B:
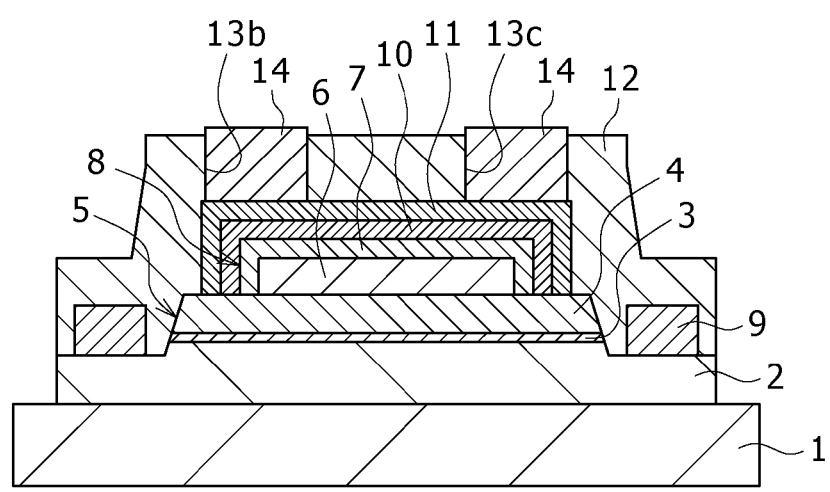

A light emitting diode according to a third embodiment of the present invention will be described below. FIGS. 7A and 7B show this light emitting diode. FIG. 7A is a plan view, and FIG. 7B is a sectional view along line Y-Y in FIG. 7A.

As shown in FIGS. 7A and 7B, this light emitting diode includes an insulating film 12 that is formed to cover a fourth metal film 11, the side face of a mesa portion 5, the surface of an n-type nitride III-V compound semiconductor layer 2 other than the mesa portion 5, and an n-electrode 9. At least lower part of the insulating film 12 is formed of a silicon nitride film. This silicon nitride film encompasses a stoichiometric $Si_3N_4$ film formed by low-pressure CVD or the like, and a non-stoichiometric SiN film formed by plasma CVD or the like. Specifically, the insulating film 12 is formed of e.g. a silicon nitride film and a silicon oxide film on the silicon nitride film. The thicknesses of the lower silicon nitride film and the upper silicon oxide film are e.g. about 100 nm and 250 nm, respectively. This silicon oxide film encompasses a stoichiometric $SiO_2$ film and a non-stoichiometric SiO film. In the insulating film 12 on the fourth metal film 11, e.g. four openings 13a to 13d are provided at four corners of a square. Furthermore, pad electrodes 14 are formed inside the openings 13a to 13c on the fourth metal film 11, and a pad electrode 15 is formed inside the opening 13d on the n-electrode 9. As the pad electrodes 14 and 15, e.g. a Ti/Ni/Au structure is used (the thicknesses of the Ti film, Ni film, and Au film are 10 nm, 50 nm, and 360 nm, respectively for example). Other components of this light emitting diode are the same as those of the light emitting diodes of the first and second embodiments.

The manufacturing method for this light emitting diode is the same as that for the second embodiment except for the following additional steps. Specifically, in the third embodiment, after formation of the fourth metal film 11, the insulating film 12 is formed over the entire face by CVD or the like. Subsequently, predetermined part in the insulating film 12 is removed by etching to form the openings 13a to 13d, followed by formation of the pad electrodes 14 inside the openings 13a to 13c and formation of the pad electrode 15 inside the opening 13d.

The third embodiment can offer the following advantages in addition to the same advantages as those by the first and second embodiments. Specifically, in the third embodiment, the insulating film 12 of which at least lower part is formed of a silicon nitride film is formed to cover the fourth metal film 11, the side face of the mesa portion 5, the n-type nitride III-V compound semiconductor layer 2 other than the mesa portion 5, and the n-electrode 9. This silicon nitride film having a dense structure can prevent intrusion of water from the external, and consequently can prevent leakage of the p-n junction more surely. Thus, the reliability and life of the light emitting diode can be further enhanced. In addition, because the pad electrodes 14 and 15 are formed inside the openings 13a to 13c and 13d, respectively, in the insulating film 12, the light emitting diode can be supported by these four pad electrodes 14 and 15 when being mounted, which allows the light emitting diode to be surely mounted in a stable state.

Figure 8:
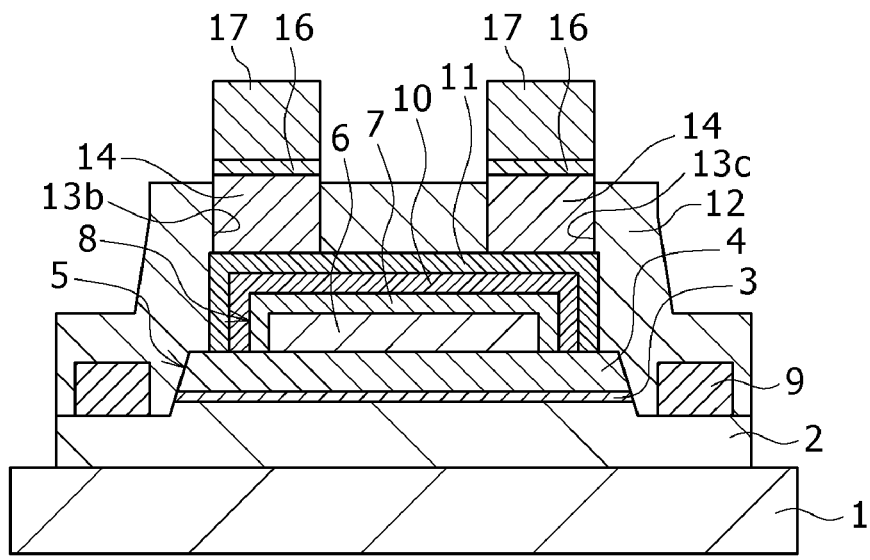
FIG. 8 is a sectional view showing a light emitting diode according to a fourth embodiment of the present invention.

A light emitting diode according to a fourth embodiment of the present invention will be described below. FIG. 8 shows this light emitting diode.

As shown in FIG. 8, in this light emitting diode, Au plated layers 17 are formed over pad electrodes 14 and 15 with seed layers 16 therebetween. The seed layers 16 are composed of e.g. Au and have a thickness of e.g. 100 nm. The thickness of the Au plated layers 17 is e.g. 2500 nm. Other components of this light emitting diode are the same as those of the light emitting diodes of the first to third embodiments.

The manufacturing method for this light emitting diode is the same as those for the first to third embodiments, except that the seed layers 16 are formed on the pad electrodes 14 and 15 and then the Au plated layers 17 are formed by plating with use of the seed layers 16.

The fourth embodiment can offer the same advantages as those by the first to third embodiments.

Figure 9:
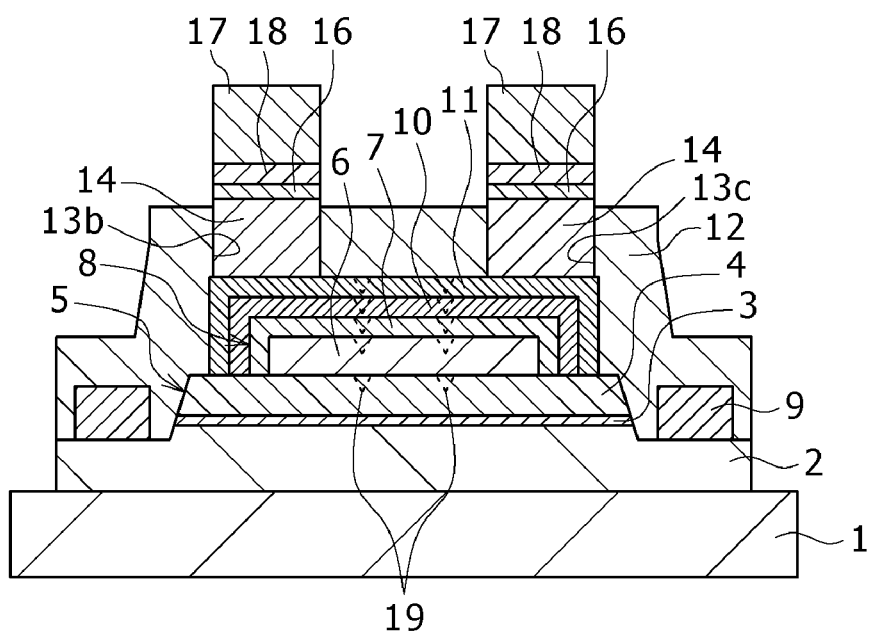
FIG. 9 is a sectional view showing a light emitting diode according to a fifth embodiment of the present invention.

A light emitting diode according to a fifth embodiment of the present invention will be described below. FIG. 9 shows this light emitting diode.

As shown in FIG. 9, this light emitting diode includes fifth metal films 18 that are composed mainly of Pd and/or Pt and formed between seed layers 16 on pad electrodes 14 and 15 and Au plated layers 17. Other components of this light emitting diode are the same as those of the light emitting diodes of the first to fourth embodiments.

The manufacturing method for this light emitting diode is the same as those for the first to fourth embodiments, except that the fifth metal films 18 are formed by plating on the seed layers 16 on the pad electrodes 14 and 15 and then the Au plated layers 17 are formed on the fifth metal films 18 by plating.

The fifth embodiment can offer the following advantages in addition to the same advantages as those by the fourth embodiment. Specifically, when a p-type nitride III-V compound semiconductor layer 4 is being grown, pits 19 arising from threading dislocations often occur at the surface of the p-type nitride III-V compound semiconductor layer 4 as indicated by the dashed lines in FIG. 9. If the pits 19 have occurred in this manner, recesses (indicated by dashed lines) reflecting the steps of the pits 19 are generated also in the respective layers from the first metal film 6 to the Au plated layers 17, formed over the p-type nitride III-V compound semiconductor layer 4. The crystallinity, shape, and coverage of the respective layers around the recesses are unfavorable in general. Therefore, there is a possibility that Ag contained in the first metal film 6 migrates along the recesses to finally reach the Au plated layers 17 and react with the Au plated layers 17. In contrast, in the fifth embodiment, the fifth metal films 18 composed mainly of Pd and/or Pt are formed under the Au plated layers 17. Therefore, even if the pits 19 have occurred at the surface of the p-type nitride III-V compound semiconductor layer 4, the anti-Ag-migration effect by the fifth metal films 18 can effectively prevent Ag contained in the first metal film 6 from reaching the Au plated layers 17.

Thus, mounting strength deterioration due to diffusion of Ag into the Au plated layers 17 can be prevented. Furthermore, it can also be prevented that Ag ions resulting from further migration from the Au plated layers 17 to the external have an adverse effect on the reliability.

A light emitting diode according to a sixth embodiment of the present invention will be described below. In the sixth embodiment, a recess-projection substrate is employed as a substrate used for growth of a nitride III-V compound semiconductor layer included in a light emitting diode.

FIGS. 10A to 10F show a method for manufacturing a light emitting diode according to the sixth embodiment in the order of steps.

Figure 10A:
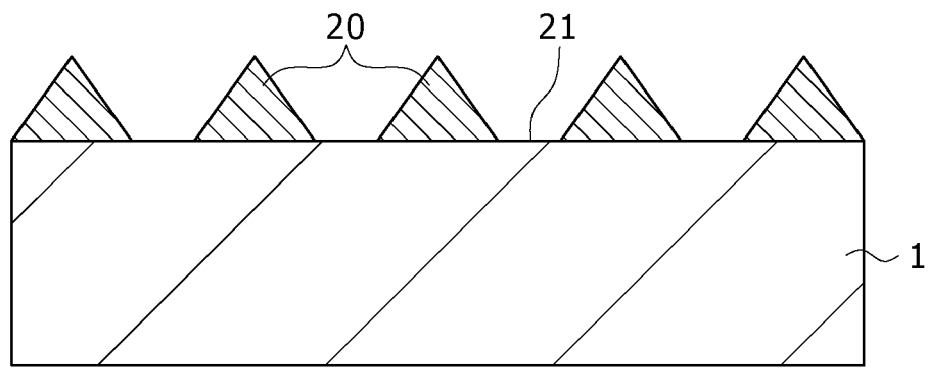
FIGS. 10A to 10F are sectional views for explaining a method for manufacturing a light emitting diode according to a sixth embodiment of the present invention.
Figure 11:
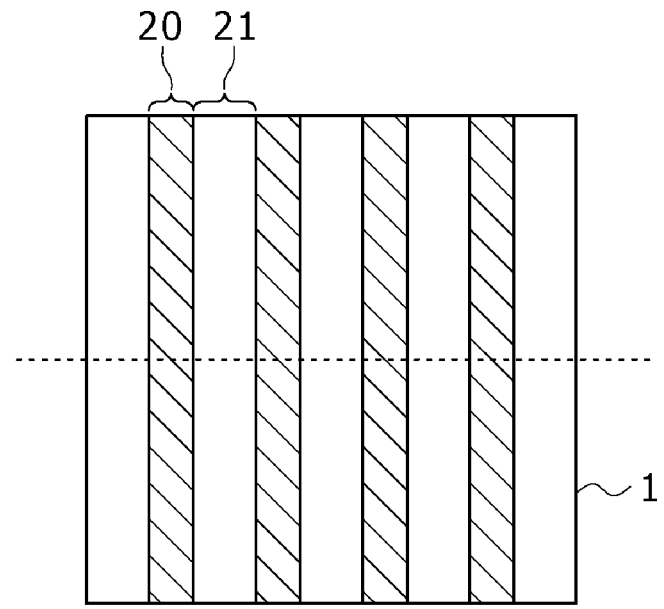
FIG. 11 is a plan view showing an example of the planar shape of projections formed on a substrate in the method for manufacturing a light emitting diode according to the sixth embodiment of the present invention.
Figure 12:
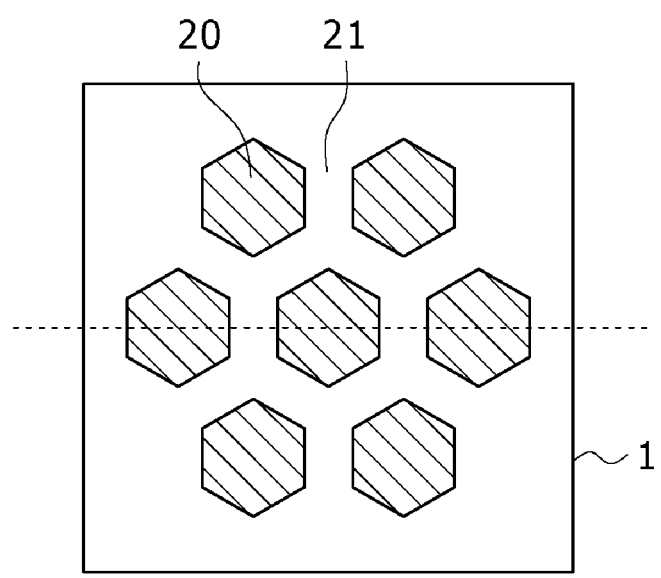
FIG. 12 is a plan view showing an example of the planar shape of projections formed on a substrate in the method for manufacturing a light emitting diode according to the sixth embodiment of the present invention.

In the sixth embodiment, as shown in FIG. 10A, a substrate 1 that has one flat major face and is composed of a material transmissive for light of the emission wavelength is prepared. Furthermore, on the substrate 1, projections 20 that each has an isosceles triangular sectional shape and a predetermined planar shape are formed periodically. Therefore, between the respective two of the projections 20, recesses 21 having an inverted trapezoidal sectional shape are formed. Any of the above-described materials can be used for the substrate 1 for example. Specifically, the substrate 1 is e.g. a sapphire substrate and the major face thereof is e.g. the c-plane. The planar shapes of the projections 20 and the recesses 21 may be any of the above-described various planar shapes. For example, the planar shapes shown in FIGS. 11 and 12 are available. In FIG. 11, both the projections 20 and the recesses 21 have a stripe shape extending in one direction. In FIG. 12, the projections 20 each having a hexagonal planar shape are two-dimensionally arranged in a honeycomb pattern. Typically, the direction along the dotted line in FIG. 11 (direction perpendicular to the stripe) is set parallel to the a-axis of a nitride III-V compound semiconductor layer 23 to be described later. Furthermore, the direction along the dotted line in FIG. 12 (direction along the line interconnecting the centers of the nearest projections 20) is set parallel to the m-axis of the nitride III-V compound semiconductor layer 23 to be described later. If the substrate 1 is a sapphire substrate, the extension direction of the stripe shape of the projections 20 and the recesses 21 in FIG. 11 is parallel to <1-100> direction of the sapphire substrate. In addition, the extension direction of the recesses 21 in FIG. 12 is parallel to <1-100> direction of the sapphire substrate. As the material of the projections 20, e.g. $SiO_2$ is suitably used in terms of easiness of processing, although any of the above-described materials may be used.

To form the projections 20 of which sectional shape is an isosceles triangle on the substrate 1, a known method can be used. For example, a film (e.g., an $SiO_2$ film) as the material of the projections 20 is formed over the entire surface of the substrate 1 by CVD, vacuum evaporation, sputtering or the like. Subsequently, a resist pattern having a predetermined shape is formed on this film by lithography. Next, the deposited film is etched by RIE or the like with use of the resist pattern as the etching mask under a condition for taper etching, and thereby the projections 20 having an isosceles triangular sectional shape are formed.

Figure 10B:
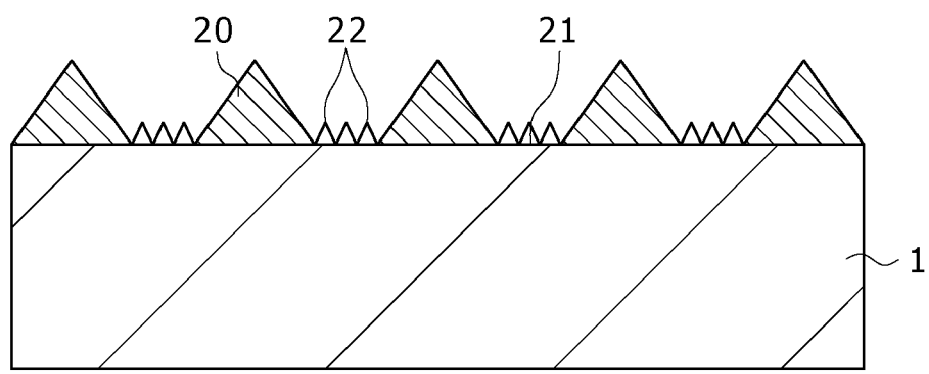
Figure 10C:
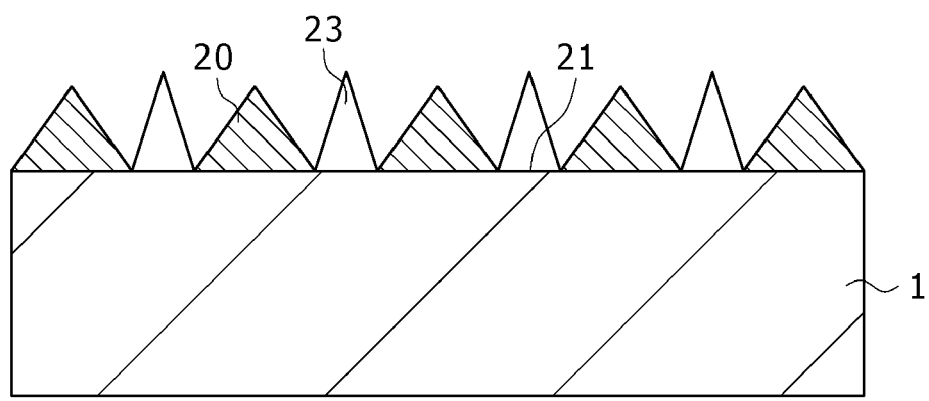

After the formation of the projections 20, the surfaces of the substrate 1 and the projections 20 are cleaned by thermal cleaning or the like. Thereafter, e.g. a GaN buffer layer or AlN buffer layer (not shown) is grown on the substrate 1 by a known method and at a growth temperature of e.g. about 550° C. Next, a nitride III-V compound semiconductor is epitaxially grown by e.g. MOCVD. This nitride III-V compound semiconductor is e.g. GaN. In this epitaxial growth, as shown in FIG. 10B, the growth is started on the bottom faces of the recesses 21, so that plural small nuclei 22 composed of a nitride III-V compound semiconductor are generated. Referring next to FIG. 10C, through processes of growth and coalescence of the small nuclei 22, the nitride III-V compound semiconductor layers 23 are grown so as to each have a sectional shape of an isosceles triangle of which base is the bottom face of the recess 21 and of which slopes are facets inclined relative to the major face of the substrate 1. In this example, the height of the nitride III-V compound semiconductor layers 23 having an isosceles triangular sectional shape is larger than that of the projections 20. For example, the extension direction of the nitride III-V compound semiconductor layers 23 is parallel to <1-100> direction thereof, and the facets of the slopes thereof are (1-101) plane. The nitride III-V compound semiconductor layers 23 may be undoped, or alternatively may be doped with an n-type or p-type impurity. The growth condition of the nitride III-V compound semiconductor layers 23 will be described later.

Subsequently to the achievement of the state of FIG. 10C, the growth of the nitride III-V compound semiconductor layers 23 is continued with the plane orientation of the facets of the slopes thereof being maintained. This further growth offers the state shown in FIG. 10D where both the ends of the nitride III-V compound semiconductor layers 23 reach lower part of the side faces of the projections 20 and thus the sectional shape of the nitride III-V compound semiconductor layers 23 has become a pentagon.

Subsequently, the growth is continued with the growth condition being set to such one that lateral growth is dominant. Due to this process, as shown in FIG. 10E, the nitride III-V compound semiconductor layers 23 are laterally grown as indicated by the arrowheads and stretch over the projections 20, so that the sectional shape thereof becomes a hexagon. In FIG. 10E, the dotted lines indicate the growth boundaries corresponding to an intermediate growth stage (the same hereinafter).

Figure 10D:
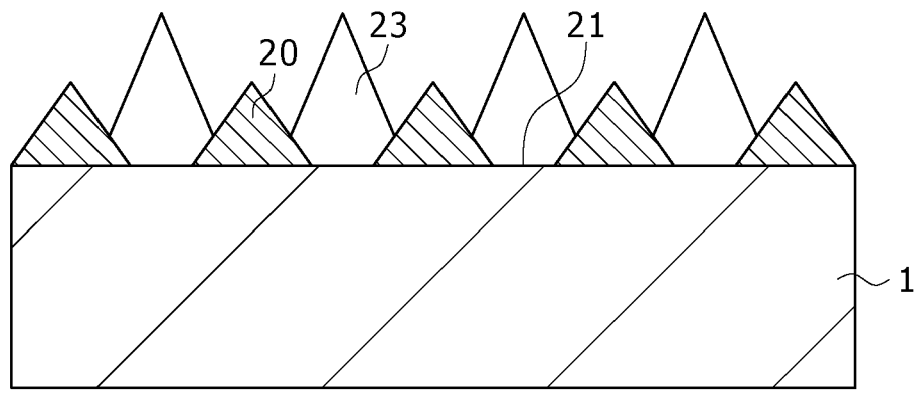
Figure 10E:
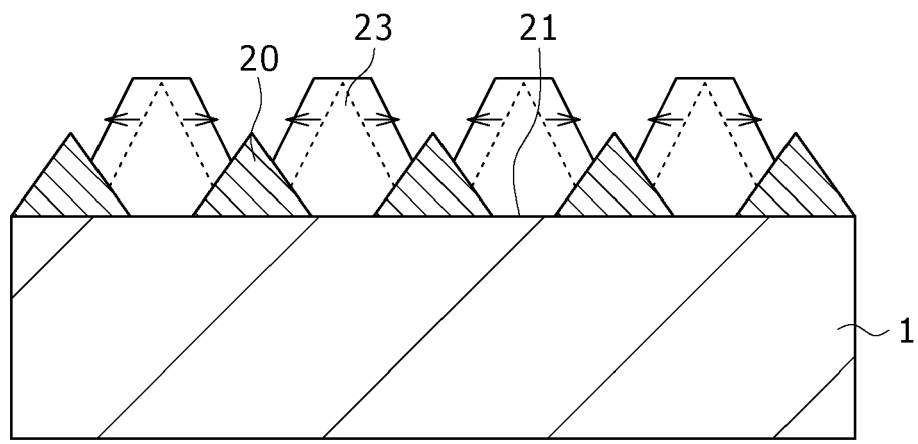
Figure 10F:
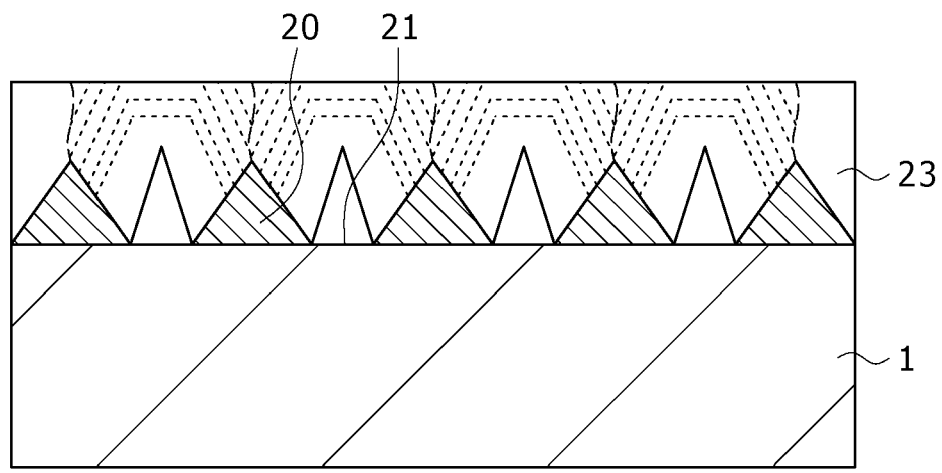

When the lateral growth is further continued, as shown in FIG. 10F, the nitride III-V compound semiconductor layers 23 are grown with its thickness being increased. Finally, the nitride III-V compound semiconductor layers 23 grown from the adjacent recesses 21 are brought into contact with each other over the projections 20 and coalesce with each other.

Consecutively, the nitride III-V compound semiconductor layers 23 are further laterally grown until the surface thereof becomes a flat plane parallel to the major face of the substrate 1 as shown in FIG. 10F. In the thus grown nitride III-V compound semiconductor layers 23, the dislocation density in part above the recesses 21 is extremely low.

Depending on the case, the growth state may be directly shifted from the state shown in FIG. 10C to that shown in FIG. 10E, without going through that shown in FIG. 10D.

After the achievement of the state of FIG. 10F, an n-type nitride III-V compound semiconductor layer 2, an active layer 3, and a p-type nitride III-V compound semiconductor layer 4 are sequentially grown over the nitride III-V compound semiconductor layer 23, similarly to the first embodiment. Furthermore, subsequent steps are also carried out similarly to the first embodiment, to thereby manufacture the intended light emitting diode.

In the thus obtained light emitting diode, light emission from the active layer 3 is obtained by applying a forward voltage between a p-electrode 8 and an n-electrode 9 to thereby apply a current therebetween. The emitted light is extracted to the external through the substrate 1. Depending on selection of the In content in the active layer 3, green or blue light emission can be obtained. Of the light emitted from the active layer 3, light directed toward the substrate 1 is refracted at the interface between the substrate 1 and the nitride III-V compound semiconductor layers 23 in the recesses 21 on the substrate 1, and then passes through the substrate 1 to the external. In contrast, light emitted from the active layer 3 and directed toward the p-electrode 8 is reflected by the p-electrode 8 so as to be directed toward the substrate 1, and then passes through the substrate 1 to the external.

Figure 13:
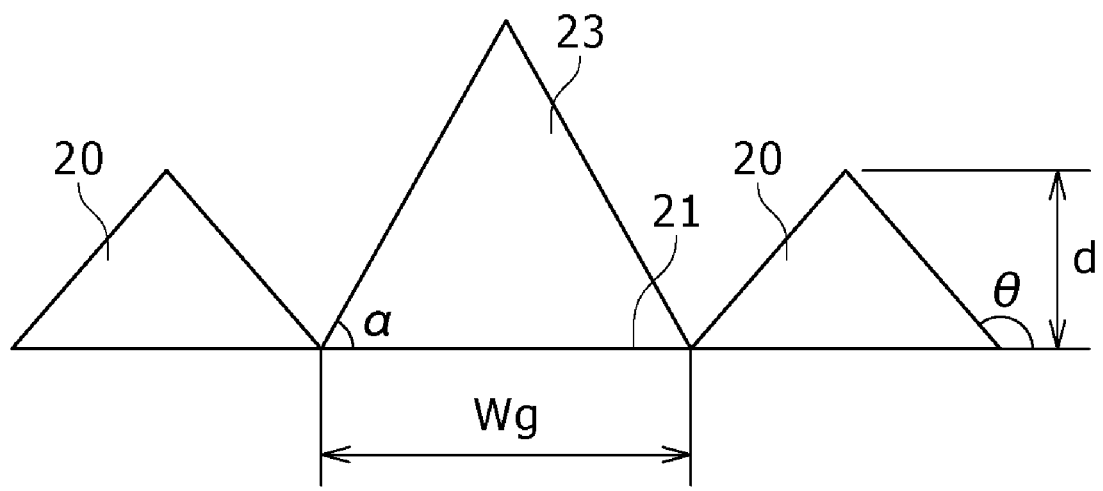
FIG. 13 is a schematic diagram showing a substrate used in the method for manufacturing a light emitting diode according to the sixth embodiment of the present invention.

In the sixth embodiment, in order to minimize the threading dislocation density in the nitride III-V compound semiconductor layers 23, various parameters are defined to satisfy the following inequality. The parameters are as follows (see FIG. 13): the width $W_g$ of the bottom faces of the recesses 21; the depth of the recesses 21, i.e., the height of the projections 20; and the angle $\alpha$ made by the major face of the substrate 1 and the slopes of the nitride III-V compound semiconductor layers 23 in the state shown in FIG. 10C.

$$2d \geq W_g \cdot \tan \alpha$$

Setting examples of the parameters are as follows: $d \geq 1.75$ μm when $W_g$ is 2.1 μm and $\alpha$ is 59°; $d \geq 1.66$ μm when $W_g$ is 2 μm and $\alpha$ is 59°; $d \geq 1.245$ μm when $W_g$ is 1.5 μm and $\alpha$ is 59°; and $d \geq 0.966$ μm when $W_g$ is 1.2 μm and $\alpha$ is 59°. In any case, it is desirable for the depth d to satisfy d<5 μm.

At the time of growth of the nitride III-V compound semiconductor layers 23 in the steps shown in FIGS. 10B, 10C and 10D, the V/III ratio of the growth source is set to a high value, e.g., a value in the range of 13000±2000, and the growth temperature is set to a low temperature, i.e., a temperature in the range of 110±50° C. This condition setting allows the nitride III-V compound semiconductor layers 23 to be grown in such a manner as to gradually filling the recesses 21 with facets thereof inclined relative to the major face of the substrate 1 appearing as slopes, as shown in FIGS. 10B, 10C and 10D. During this growth, almost no nitride III-V compound semiconductor layer 23 is grown on the projections 20. This growth of the nitride III-V compound semiconductor layers 23 is carried out under a pressure condition of 0.01 to 2.0 atmospheres, and preferably about 1.0 atmosphere. If the nitride III-V compound semiconductor layers 23 are grown under a pressure of about 0.4 atmospheres, it is preferable to employ a growth temperature in the range of 1050±50° C. The purpose of use of such a growth temperature is to suppress the lateral growth of the nitride III-V compound semiconductor layers 23 to thereby facilitate the selective growth thereof in the recesses 21. The growth rate is generally set to 0.5 to 5.0 μm/h, and preferably to about 3.0 μm/h. If the nitride III-V compound semiconductor layers 23 are GaN layers, the flow rates of the source gases are as follows: 20 SCCM for TMG, and 20 SLM for $NH_3$. At the time of growth (lateral growth) of the nitride III-V compound semiconductor layers 23 in the steps shown in FIGS. 10E and 10F, the V/III ratio of the growth source is set to a low value, e.g., a value in the range of 5000±2000, and the growth temperature is set to a high temperature, i.e., a temperature in the range of 1200±50° C. If the growth temperature is higher above this range, the surfaces of the nitride III-V compound semiconductor layers 23 readily get rough. In contrast, if it is lower below the range, pits are easily generated in the meet parts between the nitride III-V compound semiconductor layers 23. If the nitride III-V compound semiconductor layers 23 are GaN layers, the flow rates of the source gases are as follows: 40 SCCM for TMG, and 20 SLM for $NH_3$. This condition setting allows the nitride III-V compound semiconductor layers 23 to be laterally grown and achieve a flat surface, as shown in FIGS. 10E and 10F. Through this growth, no gap is generated between the nitride III-V compound semiconductor layers 23 and the substrate 1.

Figure 14:
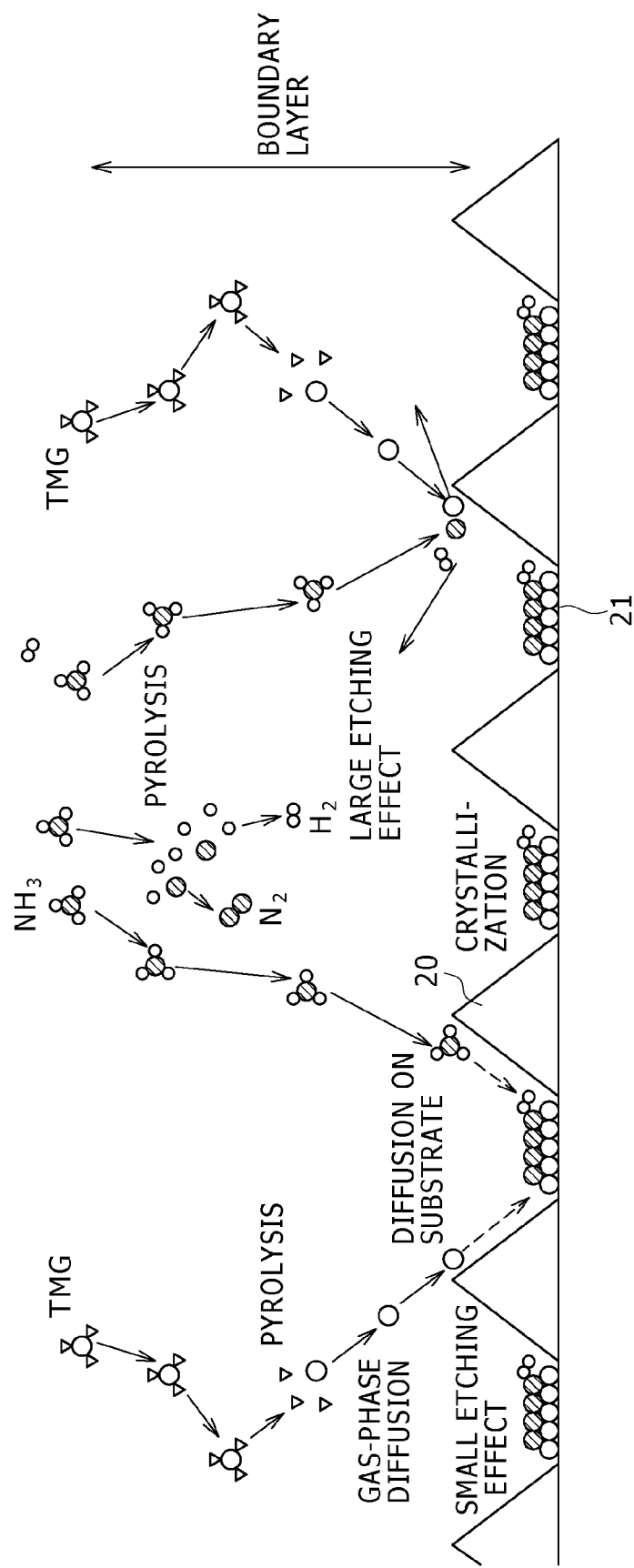
FIG. 14 is a schematic diagram for explaining the manner of growth of nitride III-V compound semiconductor layers on a substrate in the method for manufacturing a light emitting diode according to the sixth embodiment of the present invention.

FIG. 14 schematically shows the flows of source gases and the diffusion thereof on the substrate 1 when GaN layers are grown as one example of the nitride III-V compound semiconductor layers 23. The most important feature of this growth is that, at the initial growth stage, GaN is not grown on the projections 20 on the substrate 1 but the growth of GaN is started in the recesses 21. In FIG. 14, the sectional shape of the projections 20 is a triangle. However, also when the sectional shape of the projections 20 is a trapezoid, GaN is not grown on the projections 20 similarly. In general, for growth of GaN, TMG and NH$_3$ are used as the sources of Ga and N, respectively. In this case, the growth of GaN arises from direct reaction between NH$_3$ and Ga as expressed by the following reaction formulas.

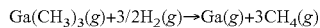

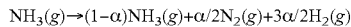

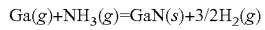

As a result of this reaction, H$_2$ gas is generated. This H$_2$ gas acts against crystal growth, i.e., the H$_2$ gas has an etching effect. In the steps shown in FIGS. 10B, 10C and 10D, growth on the projections 20 is suppressed by employing a condition that is not used in typical GaN growth on a flat substrate, i.e., a condition to enhance an etching effect and thus hinder the growth (condition with a high V/III ratio). However, inside the recesses 21, this etching effect is weakened and therefore crystal growth is caused. In a typical growth method, crystals are grown under a condition that offers an enhanced degree of lateral growth (condition with a higher temperature) in order to obtain a high flatness of the surface of the grown crystals. In contrast, in the sixth embodiment, a temperature (e.g., 1050±50° C.) lower than typical ones is employed for crystal growth as described above, for the purposes of bending threading dislocations to a direction parallel to the major face of the substrate 1 and filling the recesses 21 with the nitride III-V compound semiconductor layers 23 at an earlier stage.

Figure 15:
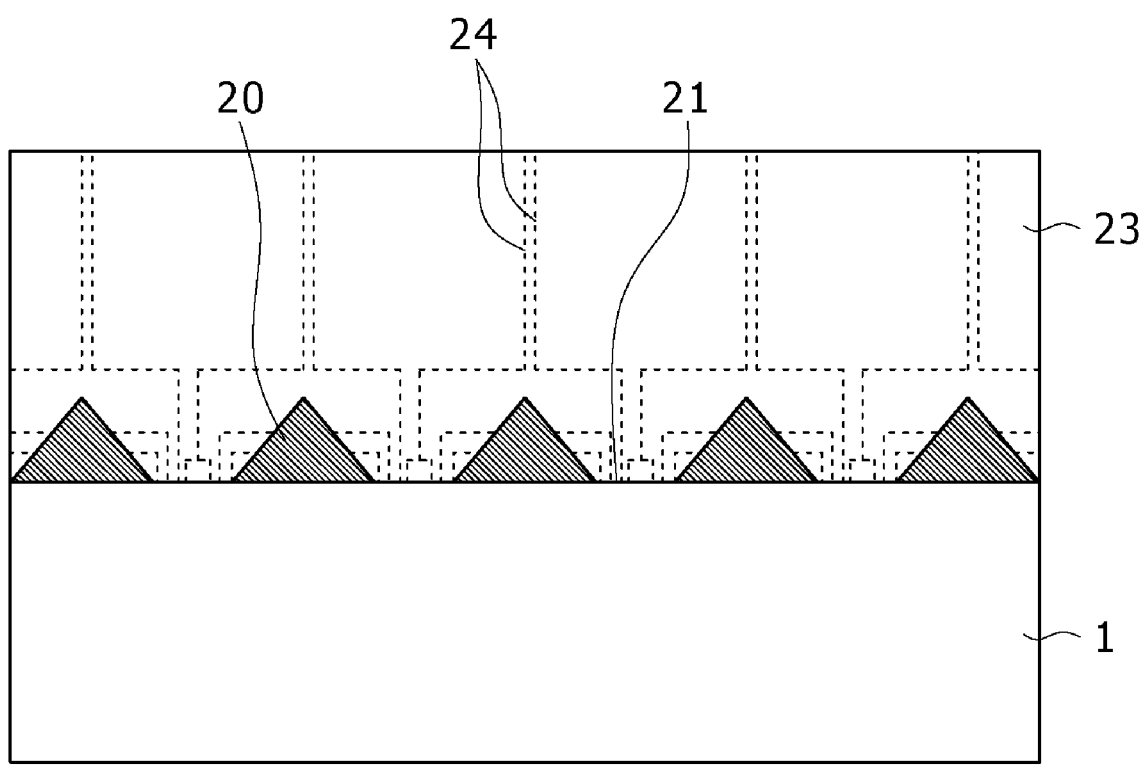
FIG. 15 is a schematic diagram for explaining the behavior of dislocations, found by a TEM observation of a nitride III-V compound semiconductor layer grown on a substrate in the method for manufacturing a light emitting diode according to the sixth embodiment of the present invention.

FIG. 15 schematically shows the result of an analysis of the crystal defect distribution in the nitride III-V compound semiconductor layers 23 with use of a transmission electron microscopy (TEM). In FIG. 15, numeral 24 indicates a threading dislocation. As is apparent from FIG. 15, the dislocation density is high in the vicinities of the center parts of the projections 20, i.e., at the meet parts between the nitride III-V compound semiconductor layers 23 grown from the recesses 21 adjacent to each other. In contrast, the dislocation density is low in the other part including parts above the recesses 21. When the depth d of the recesses 21 is 1 μm and the width W$_g$ of the bottom faces of the recesses 21 is 2 μm for example, the dislocation density in the low dislocation density part is $6 \times 10^7$/cm$^2$, which is lower by one or two orders of magnitude than that of the case where the recess-projection substrate 1 is not employed. It is also shown that no dislocation is generated along the directions perpendicular to the sidewalls of the recesses 21.

In FIG. 15, the average thickness of the regions that involve a high dislocation density and low crystallinity in the nitride III-V compound semiconductor layer 23 in contact with the substrate 1 above the recesses 21 is about 1.5 times that of the regions that involve a high dislocation density and low crystallinity in the nitride III-V compound semiconductor layer 23 in contact with the substrate 1 above the projections 20. This result reflects the fact that the nitride III-V compound semiconductor layer 23 is laterally grown above the projections 20.

Figure 16:
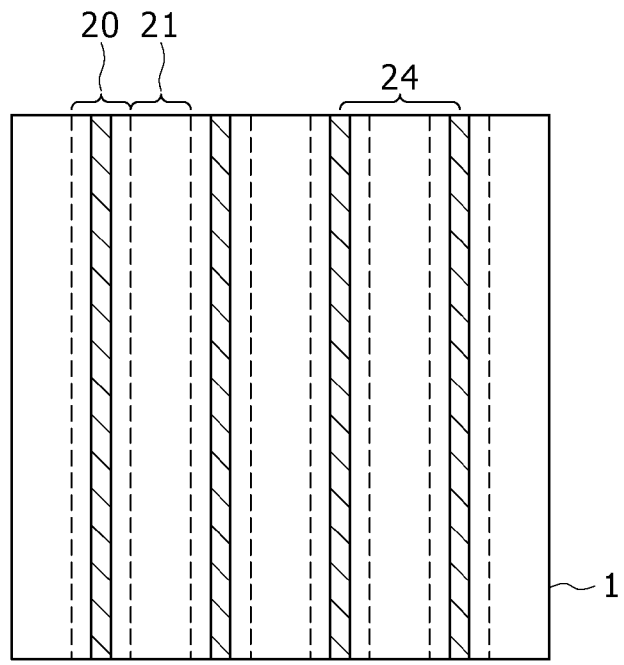
FIG. 16 is a schematic diagram showing an example of the threading dislocation distribution in a nitride III-V compound semiconductor layer grown on a substrate in the method for manufacturing a light emitting diode according to the sixth embodiment of the present invention.
Figure 17:
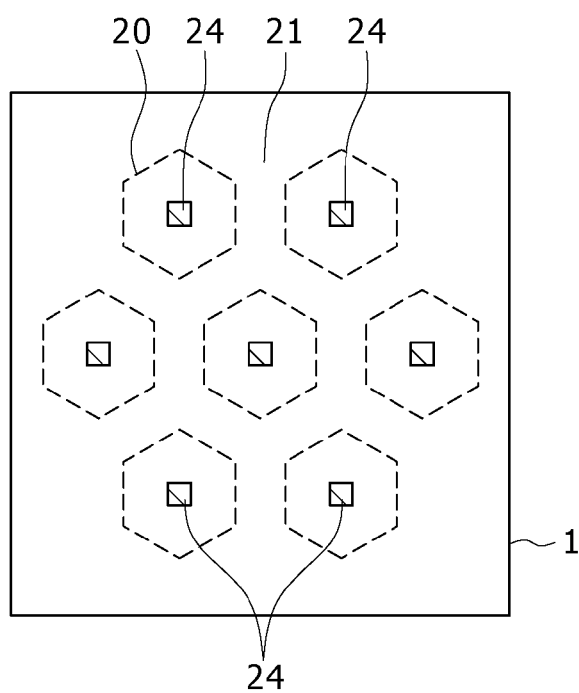
FIG. 17 is a schematic diagram showing an example of the threading dislocation distribution in a nitride III-V compound semiconductor layer grown on a substrate in the method for manufacturing a light emitting diode according to the sixth embodiment of the present invention.

FIG. 16 shows the distribution of the threading dislocations 24 when the projections 20 have the planar shape shown in FIG. 11. FIG. 17 shows the distribution of the threading dislocations 24 when the projections 20 have the planar shape shown in FIG. 12.

A description will be made below with reference to FIGS. 18A to 18F on the manner of growth of the nitride III-V compound semiconductor layer 23 from the initial growth stage and the manner of propagation of dislocations.

Upon the start of the growth, as shown in FIG. 18A, initially plural small nuclei 22 composed of a nitride III-V compound semiconductor are generated on the bottom face of the recess 21. In these small nuclei 22, dislocations (indicated by dashed lines) propagate from the interface with the substrate 1 in the vertical direction, and propagate out from the side faces of the small nuclei 22. If the growth is continued, as shown in FIGS. 18B and 18C, the nitride III-V compound semiconductor layer 23 is grown through processes of growth and coalescence of the small nuclei 22. In the processes of growth and coalescence of the small nuclei 22, bending of dislocations to a direction parallel to the major face of the substrate 1 occurs. As a result, the number of dislocations that propagate out upward becomes small. If the growth is further continued, as shown in FIG. 18D, the sectional shape of the nitride III-V compound semiconductor layer 23 becomes an isosceles triangle of which base is the bottom face of the recess 21. At this time, the number of dislocations that propagate out upward from the nitride III-V compound semiconductor layer 23 has been greatly reduced. Subsequently, as shown in FIG. 18E, the nitride III-V compound semiconductor layer 23 is laterally grown. During this lateral growth, of dislocations that have propagated to the side face of the nitride III-V compound semiconductor layer 23 having a sectional shape of an isosceles triangle of which base is the bottom face of the recess 21, dislocations existing at positions lower than the peaks of the projections 20 keep on extending in parallel to the major face of the substrate 1 to the side faces of the projections 20 and disappear thereat. On the other hand, dislocations existing at positions higher than the peaks of the projections 20 extend in parallel to the major face of the substrate 1 and reach the side face of the laterally grown nitride III-V compound semiconductor layer 23. If the lateral growth of the nitride III-V compound semiconductor layer 23 is further continued, as shown in FIG. 18F, the nitride III-V compound semiconductor layers 23 grown from both the sides of the projections 20 meet each other above the projections 20, so that eventually the surface of the resultant nitride III-V compound semiconductor layer 23 becomes a flat surface parallel to the major face of the substrate 1. When the nitride III-V compound semiconductor layers 23 meet above the projections 20, dislocations in the nitride III-V compound semiconductor layers 23 bend upward (to the direction perpendicular to the major face of the substrate 1) so as to become threading dislocations.

Figure 19A:
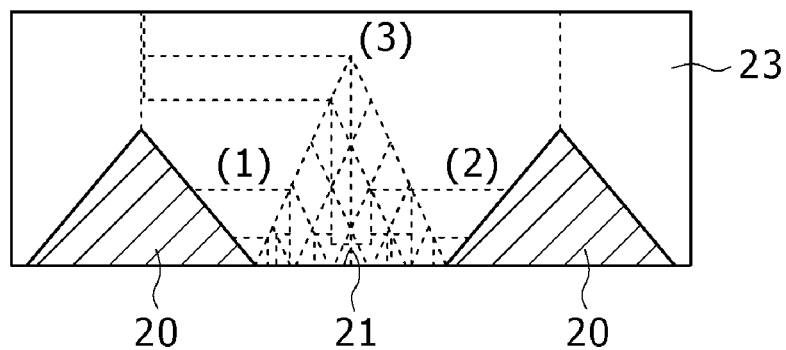
FIGS. 19A and 19B are schematic diagrams showing the behavior of dislocations in a nitride III-V compound semiconductor layer grown on a substrate in the method for manufacturing a light emitting diode according to the sixth embodiment of the present invention.
Figure 19B:
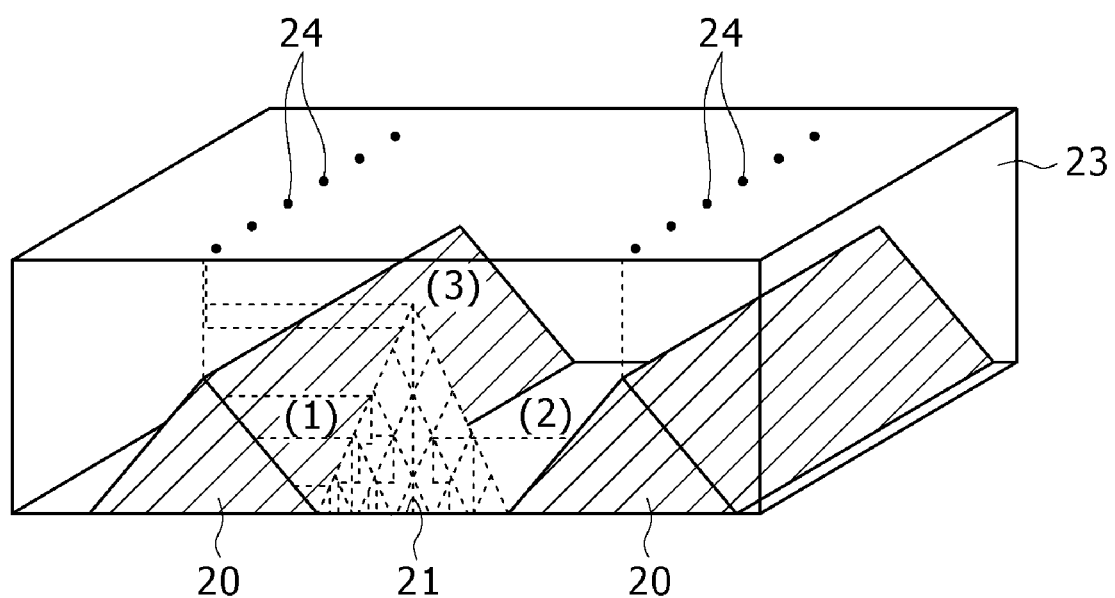

With reference to FIGS. 19A and 19B, another description will be anew made below on the behavior of dislocations during the period from creation of the small nuclei 22 to completion of lateral growth of the nitride III-V compound semiconductor layer 23. As shown in FIGS. 19A and 19B, through processes of generation, growth and coalescence of the small nuclei 22, dislocations generated from the interface with the substrate 1 repeatedly bend to a horizontal direction so as to be integrated (dislocations (1)). Furthermore, dislocations thus bent to a horizontal direction extend to the side faces of the projections 20 and disappear thereat (dislocations (2)). Moreover, dislocations generated from the interface with the substrate 1 bend one time and propagate to the surface of the nitride III-V compound semiconductor layer 23 (dislocations (3)). Due to the integration of dislocations, and the extension to the side faces of the projections 20 and the disappearance thereat of dislocations bent to a horizontal direction, the nitride III-V compound semiconductor layer 23 can be obtained that involves a smaller amount of threading dislocations than that in the case where the small nuclei 22 are not generated.

Figure 20A:
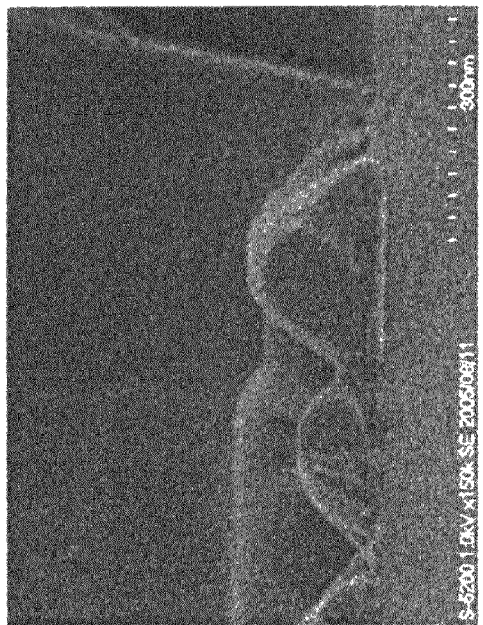
FIGS. 20A to 20C are photographs showing the initial growth stage of nitride III-V compound semiconductor layers to be grown on a substrate in the method for manufacturing a light emitting diode according to the sixth embodiment of the present invention.
Figure 20B:
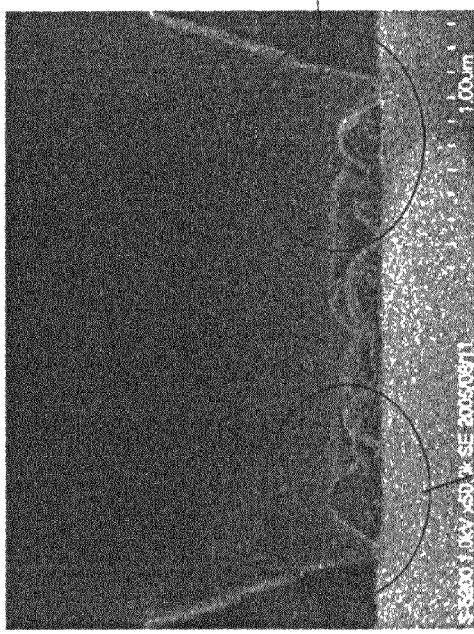
Figure 20C:

FIGS. 20A to 20C show cross-sectional TEM images of a structure corresponding to the state where the small nuclei 22 are generated on the bottom face of the recess 21 as shown in FIG. 18A. FIGS. 20B and 20C are cross-sectional TEM images arising from enlargement of the parts surrounded by the ovals in FIG. 18A. These images clearly show the state where the small nuclei 22 are generated at the initial stage of layer growth.

A description will be made below on how the behavior of dislocations generated in the nitride III-V compound semiconductor layer 23 differs between the case where the small nuclei 22 are generated at the initial growth stage and the case where they are not generated.

Figure 21A:
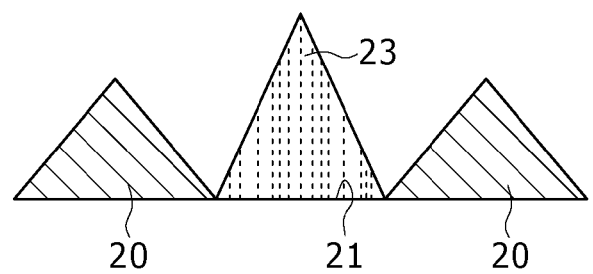
FIGS. 21A to 21C are schematic diagrams showing the manner of growth of nitride III-V compound semiconductor layers on a substrate, when small nuclei are not generated at the initial growth stage, in the method for manufacturing a light emitting diode according to the sixth embodiment of the present invention.
Figure 21B:
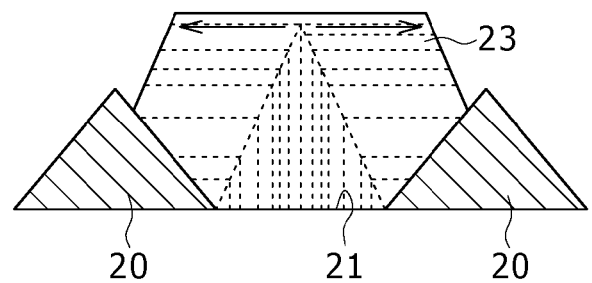
Figure 21C:
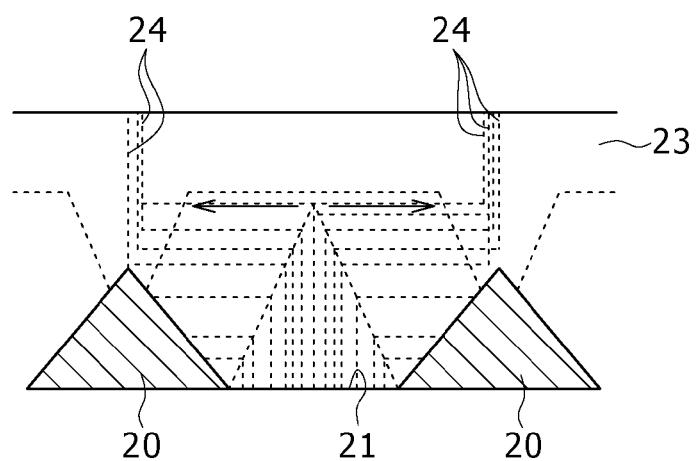
Figure 22A:
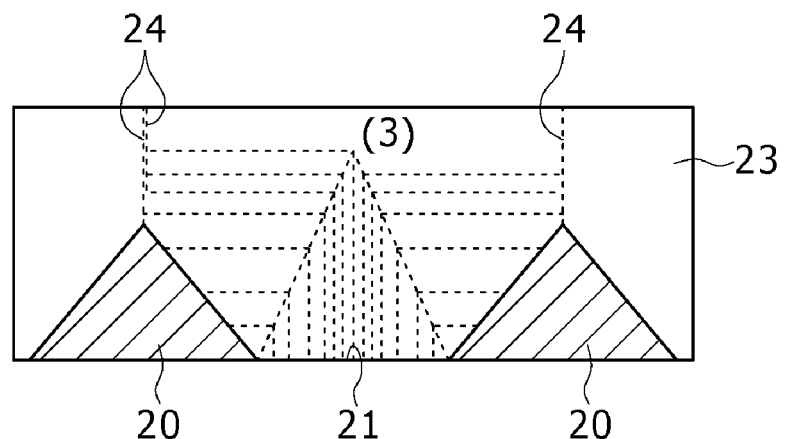
FIGS. 22A and 22B are schematic diagrams showing the behavior of dislocations in a nitride III-V compound semiconductor layer grown on a substrate, when small nuclei are not generated at the initial growth stage, in the method for manufacturing a light emitting diode according to the sixth embodiment of the present invention.
Figure 22B:
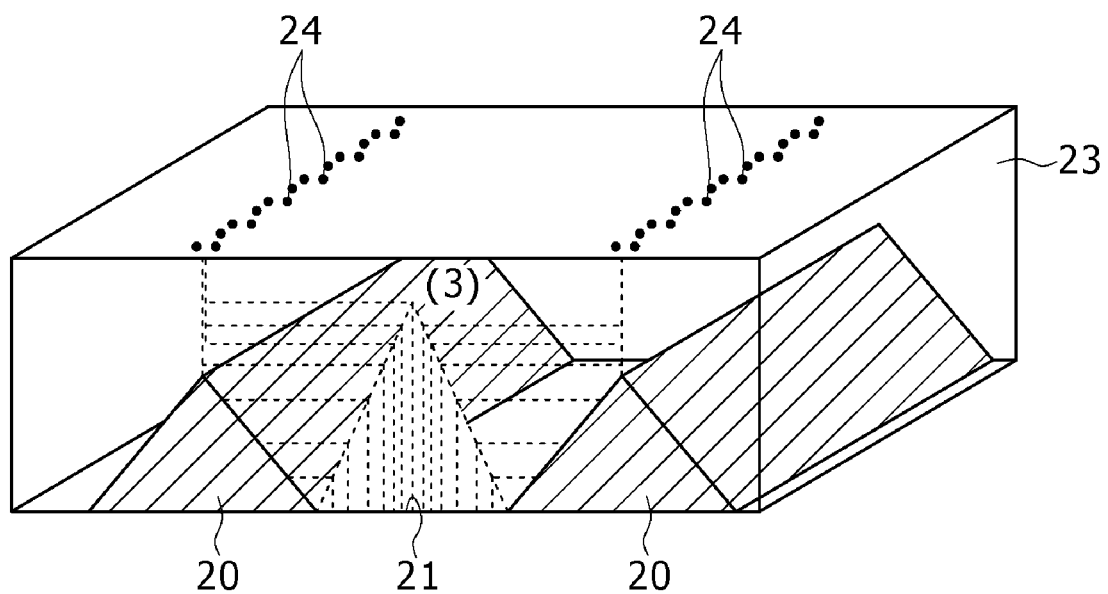

FIGS. 21A to 21C show states obtained when the small nuclei 22 are not generated at the initial growth stage of the nitride III-V compound semiconductor layer 23. The states shown in FIGS. 21A to 21C correspond to the states shown in FIGS. 18D to 18F, respectively. If the small nuclei 22 are not generated at the initial growth stage, at the timing when the nitride III-V compound semiconductor layer 23 has been grown to have a sectional shape of an isosceles triangle of which base is the bottom face of the recess 21, only dislocations that extend upward from the interface with the bottom face of the recess 21 exist as shown in FIG. 21A. The density of these dislocations is higher than that in the state shown in FIG. 18D in general. If the growth is continued, as shown in FIG. 21B, of dislocations that have propagated to the side face of the nitride III-V compound semiconductor layer 23 having a sectional shape of an isosceles triangle of which base is the bottom face of the recess 21, dislocations existing at positions lower than the peaks of the projections 20 keep on extending in parallel to the major face of the substrate 1 to the side faces of the projections 20 and disappear thereat. On the other hand, dislocations existing at positions higher than the peaks of the projections 20 extend in parallel to the major face of the substrate 1 and reach the side face of the laterally grown nitride III-V compound semiconductor layer 23. If the lateral growth of the nitride III-V compound semiconductor layer 23 is further continued, as shown in FIG. 21C, the nitride III-V compound semiconductor layers 23 grown from both the sides of the projections 20 meet each other above the projections 20, so that eventually the surface of the resultant nitride III-V compound semiconductor layer 23 becomes a flat surface parallel to the major face of the substrate 1. When the nitride III-V compound semiconductor layers 23 meet above the projections 20, dislocations in the nitride III-V compound semiconductor layers 23 bend upward so as to become the threading dislocations 24. The density of the threading dislocations 24 is sufficiently low. However, this density is higher than that when the small nuclei 22 are generated on the bottom face of the recess 21 at the initial growth stage. The reason for this is because, if the small nuclei 22 are not generated, dislocations generated from the interface with the substrate 1 bend to a horizontal direction one time when reaching a slope of an isosceles triangle of which base is the bottom face of the recess 21 as shown in FIGS. 22A and 22B. That is, in this case, the effect of the integration of dislocations through the processes of generation, growth and coalescence of the small nuclei 22 may not be obtained.

Figure 23:
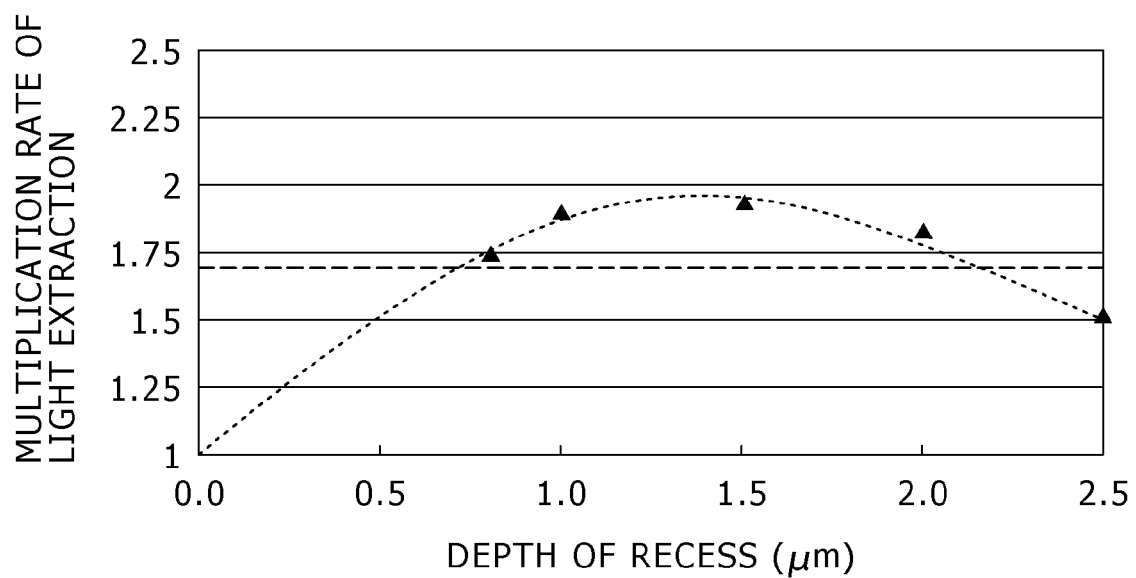
FIG. 23 is a schematic diagram showing the result of a ray-tracing simulation on a light emitting diode manufactured based on the sixth embodiment of the present invention.

FIG. 23 shows one example of the result of a simulation test (ray-tracing simulation) on the degrees of an improvement of efficiency of light extraction from a light emitting diode to the external, obtained with the depth of the recesses on the substrate 1 being variously changed. The improvement degrees are based on a comparison with the case where a flat substrate having thereon no recess and projection is used. The simulation is based on an assumption that light is extracted from the backside of the substrate 1. In FIG. 23, the abscissa indicates the depth of the recesses 21 (height of the projections 20). The ordinate indicates the degree of enhancement of light extraction efficiency η (multiplication rate of light extraction) from the efficiency obtained when the projections 20 are not formed. The projections 20 have a stripe shape extending in one direction. The angle θ made by the side faces of the projections 20 and one major face of the substrate 1 is 135°. The length $W_g$ of the bottom faces of the recesses 21 is 2 μm, and the length of the bottom faces of the projections 20 is 3 μm. The simulation is based on an assumption that the refractive indexes of the substrate 1 and the nitride III-V compound semiconductor layer 23 are 1.77 and 2.35, respectively. According to FIG. 23, the light extraction multiplication rate is larger than 1.35 when the depth of the recesses 21 is larger than 0.3 μm. The rate is larger than 1.5 when the depth is from 0.5 μm to 2.5 μm. The rate is larger than 1.75 when the depth is from 0.7 μm to 2.15 μm. The rate is larger than 1.85 when the depth is from 1 μm to 1.75 μm. The rate takes the maximum value (about 1.95) when the depth is about 1.3 μm.

The sixth embodiment can offer the following advantages in addition to the same advantages as those by the first embodiment. Specifically, no gap is formed between the substrate 1 and the nitride III-V compound semiconductor layer 23. Therefore, lowering of the light extraction efficiency attributed to gaps can be prevented. Furthermore, threading dislocations in the nitride III-V compound semiconductor layer 23 concentrate in the vicinities of the center parts of the projections 20 on the substrate 1, and the dislocation density in the other part is greatly reduced, e.g. to about $6\times10^7/cm^2$, compared with that by existing methods in which a recess-projection substrate is not used. Therefore, the crystallinity of the nitride III-V compound semiconductor layers, such as the nitride III-V compound semiconductor layer 23 and the active layer 3 grown over the nitride III-V compound semiconductor layer 23, is greatly enhanced, and the number of non-luminescent centers and so on is greatly decreased. These features allow achievement of a light emitting diode of which light emission efficiency is extremely high.

In addition, the number of times of epitaxial growth necessary for manufacturing of this light emitting diode is one, and a growth mask is unnecessary. Moreover, the projections 20 on the substrate 1 can be formed merely by forming on the substrate 1 a film to serve as the material of the projections 20, such as an $SiO_2$ film, and processing the film through etching. Therefore, there is no need to process the substrate 1 such as a sapphire substrate, which is difficult to process to form recesses and projections thereon, which simplifies manufacturing steps. Thus, the light emitting diode can be manufactured at low costs.

A seventh embodiment of the present invention will be described below.

Figure 24A:
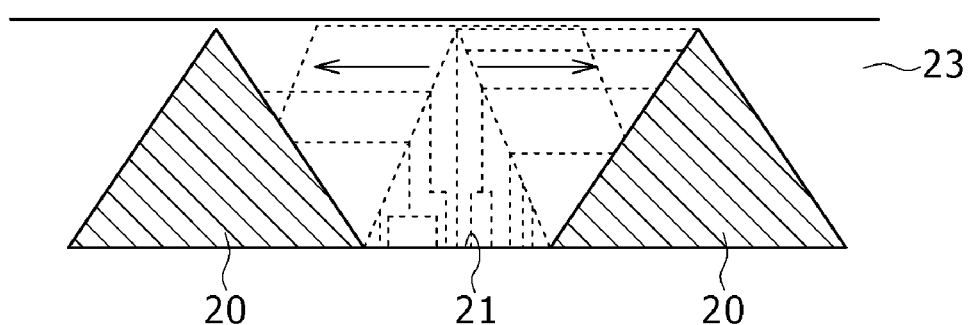
FIGS. 24A and 24B are sectional views for explaining a method for manufacturing a light emitting diode according to a seventh embodiment of the present invention.
Figure 24B:
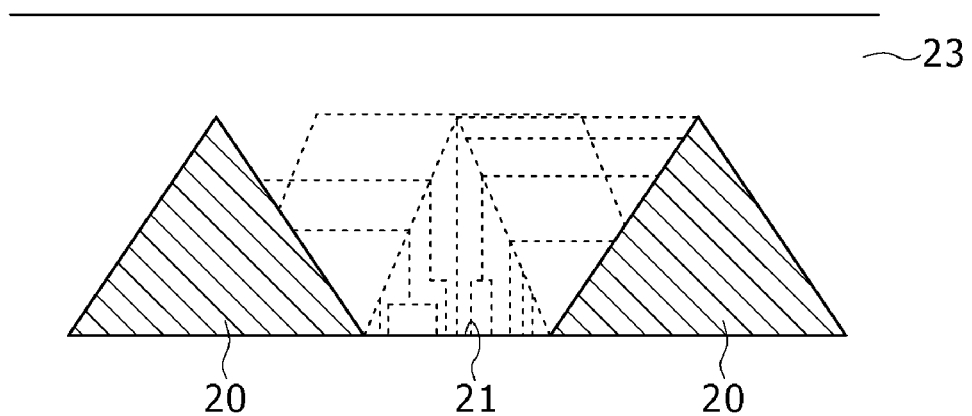

In the seventh embodiment, the height of projections 20 is defined to satisfy the following condition: at the timing when nitride III-V compound semiconductor layers 23 have been grown to have a sectional shape of an isosceles triangle of which base is the bottom face of a recess 21, the height of the nitride III-V compound semiconductor layers 23 is equal to or smaller than that of the projections 20. As one example, the case where the height of the nitride III-V compound semiconductor layers 23 is equal to that of the projections 20 is shown in FIGS. 24A and 24B. Due to this setting, all dislocations that have been generated from the interface with the substrate 1 and have propagated to the side faces of the nitride III-V compound semiconductor layer 23 having a sectional shape of an isosceles triangle of which base is the bottom face of the recess 21, keep on extending in parallel to the major face of the substrate 1 to the side faces of the projections 20 and disappear thereat. Therefore, the number of threading dislocations 24 that reach the surface of the nitride III-V compound semiconductor layer 23 is significantly reduced, so that the threading dislocation density can be made zero substantially.

Other features of the seventh embodiment are the same as those of the first to sixth embodiments.

According to the seventh embodiment, the nitride III-V compound semiconductor layer 23 of which threading dislocation density is substantially zero can be grown. Thus, a nitride III-V compound semiconductor substrate that includes no dislocation substantially can be obtained. Furthermore, by growing on this no-dislocation nitride III-V compound semiconductor substrate an n-type nitride III-V compound semiconductor layer 2, an active layer 3, and a p-type nitride III-V compound semiconductor layer 4 for example, these layers are allowed to have a greatly decreased dislocation density. Accordingly, an advantage of realization of a light emitting diode having extremely favorable properties can be achieved.

An eighth embodiment of the present invention will be described below.

Figure 25A:
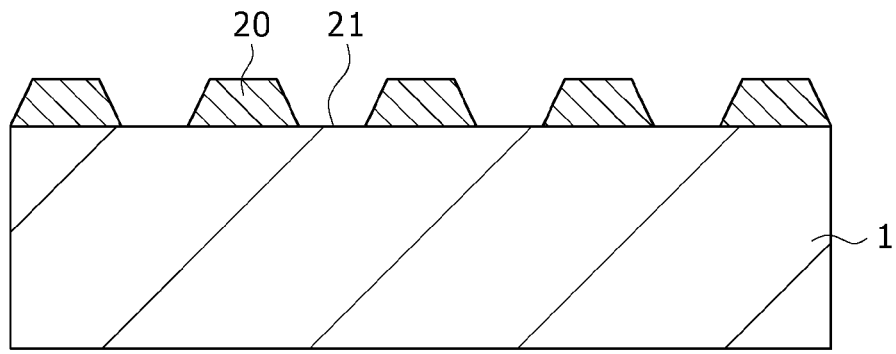
FIGS. 25A to 25C are sectional views for explaining a method for manufacturing a light emitting diode according to an eighth embodiment of the present invention.

In the eighth embodiment, as shown in FIG. 25A, projections 20 that each has a trapezoidal sectional shape and a predetermined planar shape are formed on a substrate 1 periodically. Therefore, between the respective two of the projections 20, recesses 21 having an inverted trapezoidal sectional shape are formed.

Figure 25B:
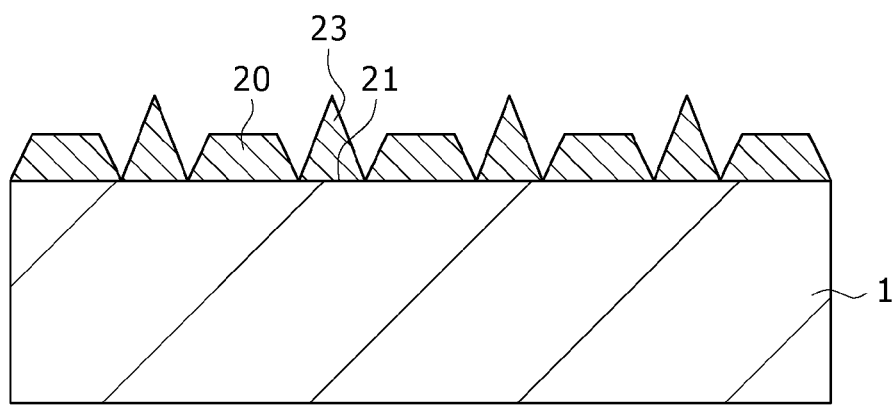
Figure 25C:
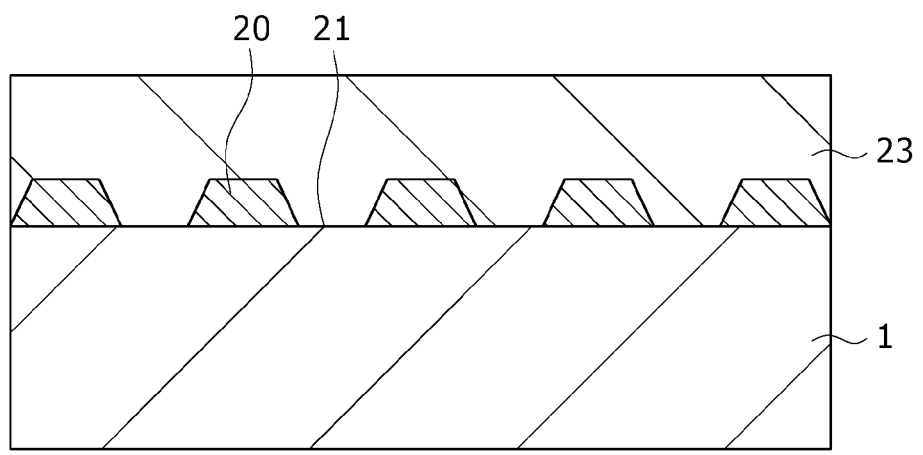

Subsequently, a nitride III-V compound semiconductor layer 23 is grown similarly to the sixth embodiment. Specifically, through processes of generation, growth and coalescence of small nuclei 22 on the bottom faces of the recesses 21, the nitride III-V compound semiconductor layers 23 each having a sectional shape of an isosceles triangle of which base is the bottom face of the recess 21 is grown as shown in FIG. 25B. Furthermore, through lateral growth, the nitride III-V compound semiconductor layer 23 having a flat surface and a low threading dislocation density is grown as shown in FIG. 25C.

Subsequent steps are carried out similarly to the sixth embodiment to thereby manufacture the intended light emitting diode.

Other features of the eighth embodiment are the same as those of the first to sixth embodiments.

Figure 26:
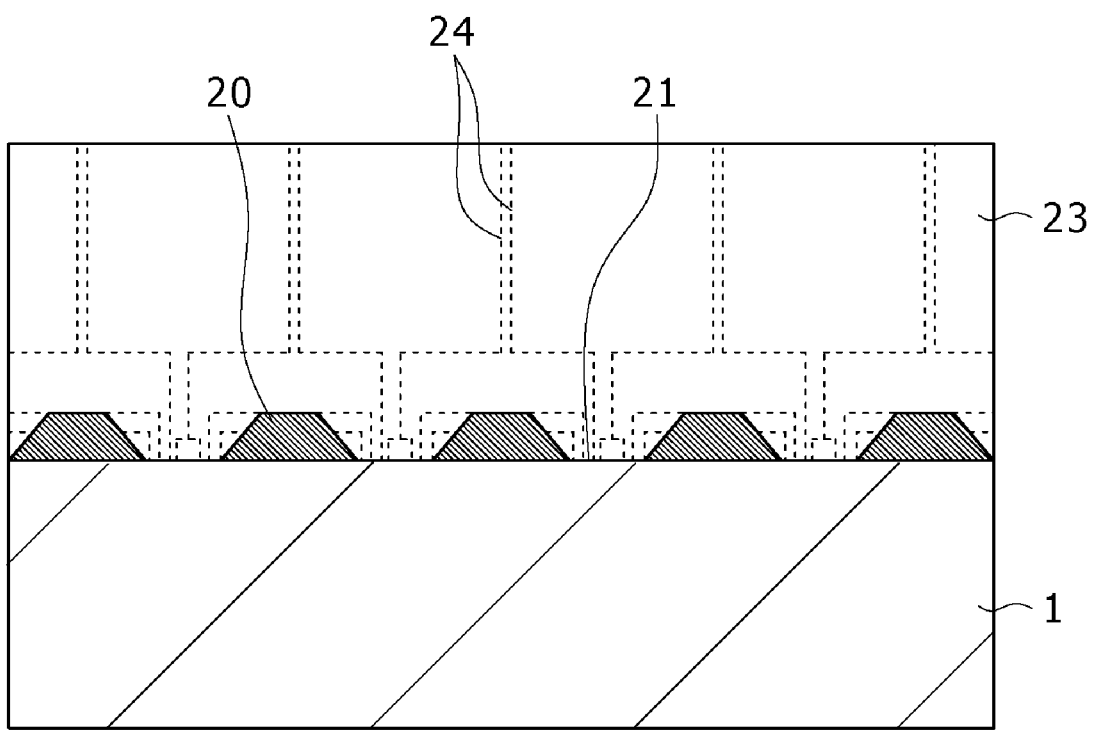
FIG. 26 is a schematic diagram for explaining the behavior of dislocations, found by a TEM observation of a nitride III-V compound semiconductor layer grown on a substrate in the method for manufacturing a light emitting diode according to the eighth embodiment of the present invention.

FIG. 26 schematically shows the result of an analysis of the crystal defect distribution in the nitride III-V compound semiconductor layer 23 with use of a TEM.

The eighth embodiment can offer the same advantages as those by the sixth embodiment.

Figure 27:
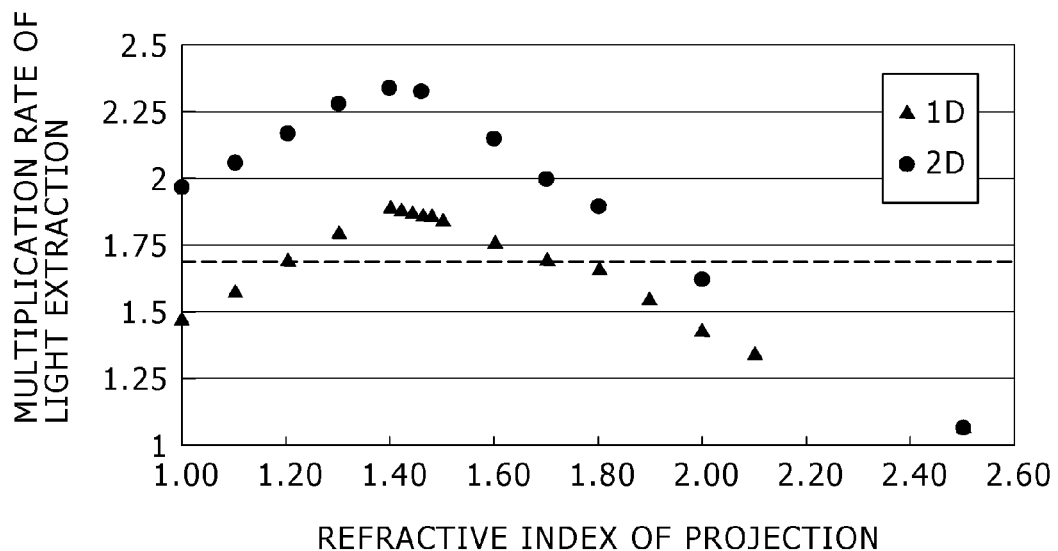
FIG. 27 is a schematic diagram showing the result of a ray-tracing simulation on a light emitting diode manufactured based on the eighth embodiment of the present invention.
Figure 28:
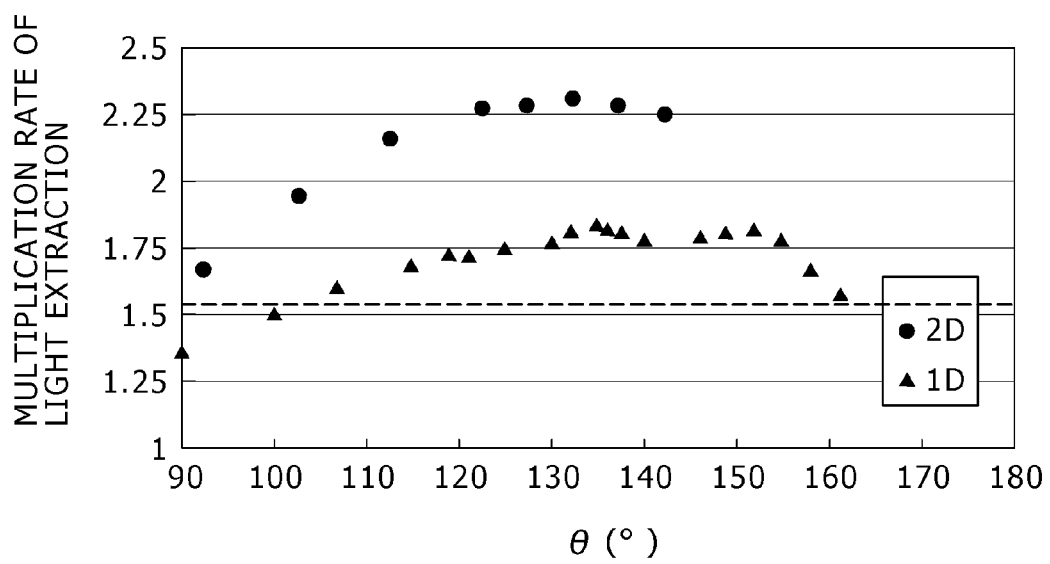
FIG. 28 is a schematic diagram showing the result of a ray-tracing simulation on a light emitting diode manufactured based on the eighth embodiment of the present invention.
Figure 29:
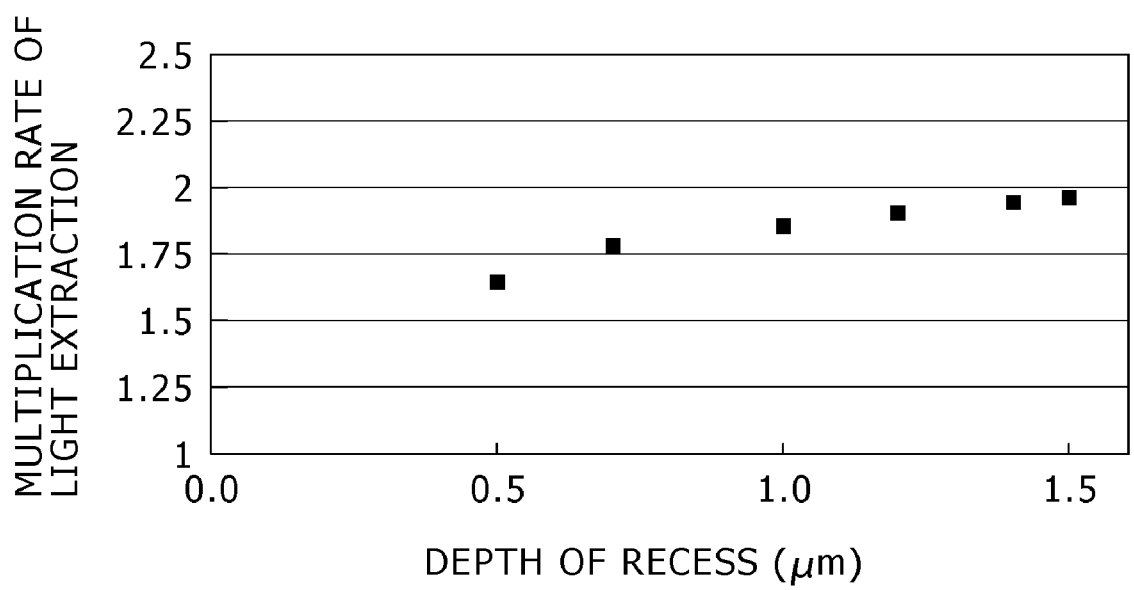
FIG. 29 is a schematic diagram showing the result of a ray-tracing simulation on a light emitting diode manufactured based on the eighth embodiment of the present invention.

FIGS. 27 to 29 show examples of the result of a simulation test on changes of efficiency of light extraction from a light emitting diode to the external, between the case where recesses and projections are formed on the substrate 1 and the case where they are not formed and thus the substrate 1 is flat. All the simulations are based on an assumption that light is extracted from the backside of the substrate 1.

In FIG. 27, the abscissa indicates the refractive index of the projections 20. The ordinate indicates the degree of enhancement of light extraction efficiency η (multiplication rate of light extraction) from the efficiency obtained when the projections 20 are not formed. Furthermore, in FIG. 27, the black triangles "▲" indicate data of a structure in which the projections 20 have the one-dimensional stripe shape shown in FIG. 11 (1D). The black circles "●" indicate data of a two-dimensional arrangement structure obtained by providing the projections 20 having the one-dimensional stripe shape perpendicularly to each other (2D). The angle θ made by the side faces of the projections 20 and one major face of the substrate 1 is 135°. The length $W_g$ of the bottom faces of the recesses 21 is 2 μm, and the length of the bottom faces of the projections 20 is 3 μm. The simulation is based on an assumption that the refractive indexes of the substrate 1 and the nitride III-V compound semiconductor layer 23 are 1.77 and 2.35, respectively. According to FIG. 27, for both 1D and 2D, the light extraction multiplication rate takes the maximum value when the refractive index of the projections 20 is 1.4, and is sufficiently large when the refractive index is in the range of 1.2 to 1.7. The light extraction multiplication rates of 2D are larger than those of 1D.

Also when the sectional shape of the projections 20 is a triangle like the sixth embodiment, a similar result was obtained.

In FIG. 28, the abscissa indicates the angle θ made by the side faces of the projections 20 and one major face of the substrate 1, and the ordinate indicates the multiplication rate of light extraction. Furthermore, in FIG. 28, the black triangles "▲" indicate data of a structure in which the projections 20 have the one-dimensional stripe shape shown in FIG. 11 (1D). The black circles "●" indicate data of a two-dimensional arrangement structure obtained by providing the projections 20 having the one-dimensional stripe shape perpendicularly to each other (2D). The length $W_g$ of the bottom faces of the recesses 21 is 3 μm, and the length of the bottom faces of the projections 20 is 2 μm. The simulation is based on an assumption that the refractive indexes of the substrate 1, the projections 20, and the nitride III-V compound semiconductor layer 23 are 1.77, 1.4, and 2.35, respectively. According to FIG. 28, for both 1D and 2D, the light extraction multiplication rate is as large as 1.55 or more when the angle θ made by the side faces of the projections 20 and one major face of the substrate 1 is in the range of 100°<θ<160°. Furthermore, the multiplication rate is as extremely large as 1.75 or more when the angle θ is in the range of 132°<θ<139°, and takes the maximum value when the angle θ is 135° in particular. In addition, for 1D, the multiplication rate is as extremely large as 1.75 or more also when the angle θ is in the range of 147°<θ<154°, and takes the maximum value also when the angle θ is 152° in particular. The multiplication rates of 2D are larger than those of 1D.

Also when the sectional shape of the projections 20 is a triangle like the sixth embodiment, a similar result was obtained.

In FIG. 29, the abscissa indicates the depth d of the recesses 21. The ordinate indicates the degree of enhancement of light extraction efficiency η (multiplication rate of light extraction) from the efficiency obtained when the projections 20 are not formed. The projections 20 have the one-dimensional stripe shape shown in FIG. 11. The ratio of the length $W_g$ of the bottom faces of the recesses 21 to the length of the bottom faces of the projections 20 is 3:2. The simulation is based on an assumption that the refractive indexes of the substrate 1, the projections 20, and the nitride III-V compound semiconductor layer 23 are 1.77, 1.4, and 2.35, respectively. FIG. 29 shows that a larger depth of the recesses 21 offers a larger light extraction multiplication rate.

A ninth embodiment of the present invention will be described below.

The ninth embodiment relates to a light emitting diode backlight manufactured by using blue and green light emitting diodes obtained by the method of the sixth embodiment and red light emitting diodes (e.g., AlGaInP-based light emitting diodes) that are separately prepared.

In the ninth embodiment, blue light emitting diode structures are formed on a substrate 1 by the method of the sixth embodiment. Subsequently, bumps (not shown) are formed on p-electrodes 8 and n-electrodes 9, and then the substrate 1 is diced into chips so that blue light emitting diodes in the form of a flip chip are obtained. In a similar manner, green light emitting diodes in the form of a flip chip are obtained. As for the red light emitting diodes, AlGaInP-based light emitting diodes are used in the form of a chip. The AlGaInP-based light emitting diodes are obtained through steps of depositing AlGaInP-based semiconductor layers over an n-type GaAs substrate to form diode structures, and forming thereon p-electrodes.

Figure 30A:
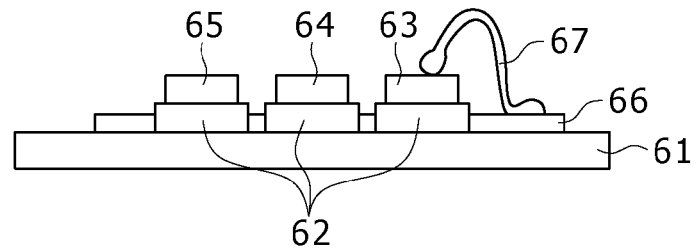
FIGS. 30A to 30C are sectional views for explaining a method for manufacturing a light emitting diode backlight according to a ninth embodiment of the present invention.

Each of the red light emitting diode chip, green light emitting diode chip, and blue light emitting diode chip is mounted on a submount composed of AlN or the like, and then the chips are mounted on a substrate such as an Al substrate based on predetermined arrangement with the submount being directed downward. The resultant state is shown in FIG. 30A. In FIG. 30A, numeral 61 indicates the substrate, and numeral 62 indicates the submounts. Furthermore, numerals 63, 64 and 65 indicate the red, green and blue light emitting diode chips, respectively. The chip size of these red, green and blue light emitting diode chips 63, 64 and 65 is e.g. 350 µm×350 µm. The mounting of these chips is carried out so that the n-electrode of the red light emitting diode chip 63 is placed on the submount 62 and the p-electrode and the n-electrode of the green and blue light emitting diode chips 64 and 65 are placed above the submount 62 via the bumps. A lead electrode (not shown) for n-electrode is formed into a predetermined pattern shape on the submount 62 on which the red light emitting diode chip 63 is mounted. The n-electrode of the red light emitting diode chip 63 is mounted on a predetermined part on the lead electrode. Furthermore, a wire 67 is bonded to the p-electrode of the red light emitting diode chip 63 and a predetermined pad electrode 66 provided on the substrate 61 so that they are coupled to each other. In addition, another wire (not shown) is bonded to one end of the lead electrode and another pad electrode provided on the substrate 61 so that they are coupled to each other. On the submount 62 on which the green light emitting diode chip 64 is mounted, a lead electrode for p-electrode and a lead electrode for n-electrode (both not shown) are formed into a predetermined pattern shape. The p-electrode and the n-electrode of the green light emitting diode chip 64 are mounted via the bumps formed thereon over predetermined parts on the lead electrode for p-electrode and the lead electrode for n-electrode. Furthermore, a wire (not shown) is bonded to one end of the lead electrode for the p-electrode of the green light emitting diode chip 64 and a pad electrode provided on the substrate 61 so that they are coupled to each other. In addition, another wire (not shown) is bonded to one end of the lead electrode for the n-electrode of the green light emitting diode chip 64 and another pad electrode provided on the substrate 61 so that they are coupled to each other. The structure around the blue light emitting diode chip 65 is similar to that around the green light emitting diode chip 64.

Figure 30B:
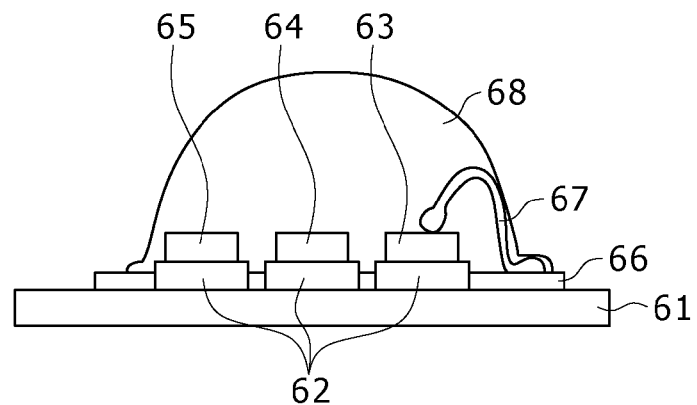
Figure 30C:
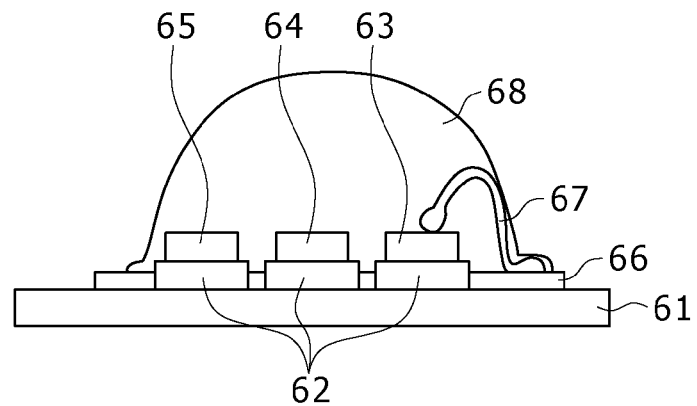
Figure 30D:
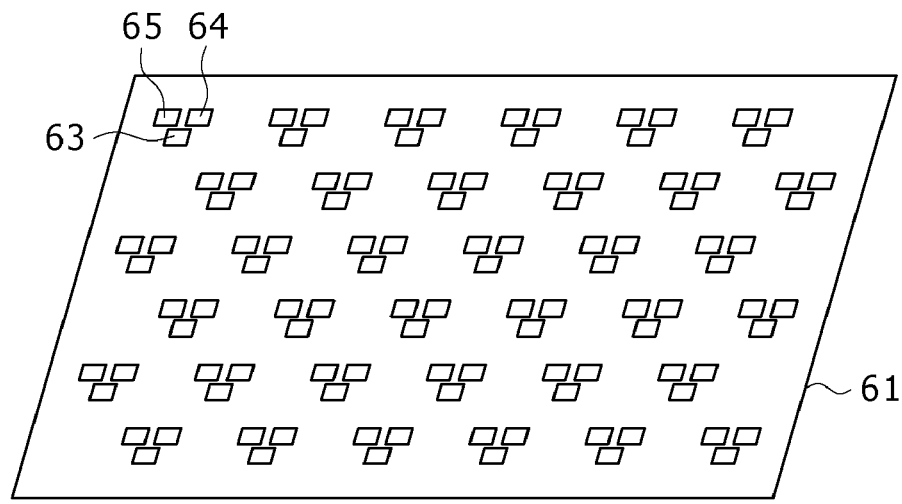
FIGS. 30D and 30E are a perspective view for explaining the method for manufacturing a light emitting diode backlight according to the ninth embodiment of the present invention.
Figure 30E:
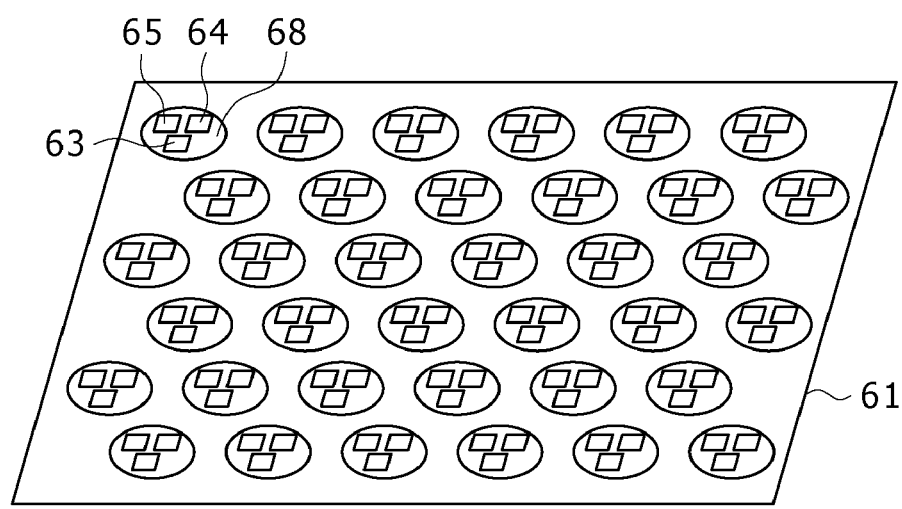

A set of the above-described red, green and blue light emitting diode chips 63, 64 and 65 is defined as one unit. The necessary number of units is arranged on the substrate 61 based on a predetermined pattern. One example of the arrangement is shown in FIG. 30D. After the arrangement, as shown in FIG. 30B, potting with a transparent resin 68 is carried out so that each one unit is covered. Subsequently, curing of the transparent resin 68 is carried out. This curing solidifies the transparent resin 68, and the resin 68 somewhat shrinks along with this solidification (FIG. 30C). In this manner, a light emitting diode backlight is obtained in which the chip units each including the red, green and blue light emitting diode chips 63, 64 and 65 are arranged in an array on the substrate 61 as shown in FIG. 30E. In the backlight, the transparent resin 68 is in contact with the back faces of the substrates 1 of the green and blue light emitting diode chips 64 and 65, which offers a smaller difference in the refractive index compared with the case where the back faces of the substrates 1 are in direct contact with air. Therefore, the ratio of light reflected by the back faces of the substrates 1 to light that passes through the substrate 1 toward the external is decreased, and thus the light extraction efficiency is enhanced, which improves the light emission efficiency.

This light emitting diode backlight is suitably used as e.g. a backlight of a liquid crystal panel.

A tenth embodiment of the present invention will be described below.

Figure 31:
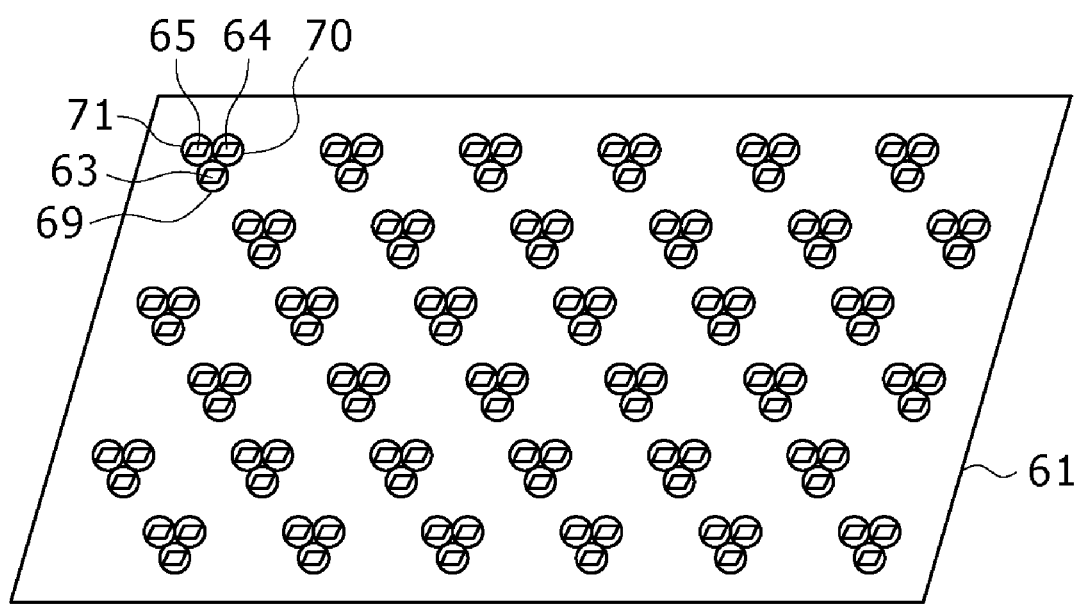
FIG. 31 is a perspective view for explaining a method for manufacturing a light emitting diode backlight according to a tenth embodiment of the present invention.

In the tenth embodiment, initially the necessary number of each of red, green and blue light emitting diode chips 63, 64 and 65 is arranged on a substrate 61 based on a predetermined pattern, similarly to the ninth embodiment. Subsequently, as shown in FIG. 31, potting with a transparent resin 69 suitable for the red light emitting diode chip 63 is carried out so that the red light emitting diode chips 63 are covered. Furthermore, potting with a transparent resin 70 suitable for the green light emitting diode chip 64 is carried out so that the green light emitting diode chips 64 are covered, and potting with a transparent resin 71 suitable for the blue light emitting diode chip 65 is carried out so that the blue light emitting diode chips 65 are covered. Subsequently, curing of the transparent resins 69 to 71 is carried out. This curing solidifies the transparent resins 69 to 71, and the resins 69 to 71 somewhat shrink along with this solidification. In this manner, a light emitting diode backlight is obtained in which the chip units each including the red, green and blue light emitting diode chips 63, 64 and 65 are arranged in an array on the substrate 61. In the backlight, the transparent resins 70 and 71 are in contact with the back faces of the substrates 1 of the green and blue light emitting diode chips 64 and 65, which offers a smaller difference in the refractive index compared with the case where the back faces of the substrates 1 are in direct contact with air. Therefore, the ratio of light reflected by the back faces of the substrates 1 to light that passes through the substrate 1 toward the external is decreased, and thus the light extraction efficiency is enhanced, which improves the light emission efficiency.

This light emitting diode backlight is suitably used as e.g. a backlight of a liquid crystal panel.

An eleventh embodiment of the present invention will be described below.

Figure 32:
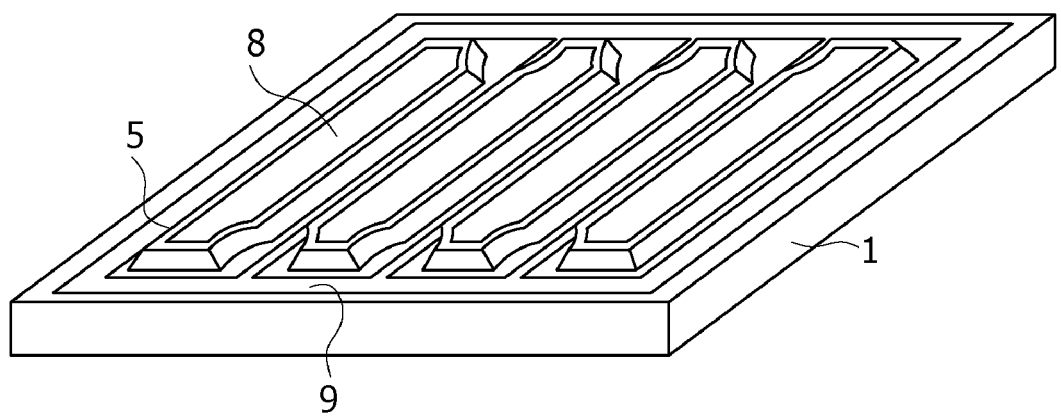
FIG. 32 is a perspective view showing an integrated light emitting diode manufactured based on an eleventh embodiment of the present invention.
Figure 33:
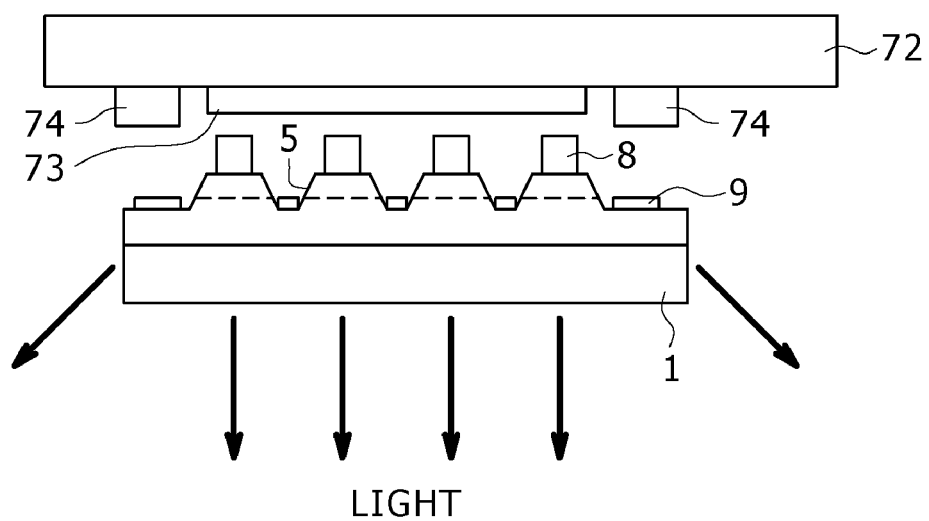
FIG. 33 is a sectional view showing the manner of mounting of an integrated light emitting diode manufactured based on the eleventh embodiment of the present invention on a submount.

In the eleventh embodiment, initially light emitting diode structures are formed on a substrate 1 by the method of the sixth embodiment so that each of p-electrodes 8 and n-electrodes 9 is formed to have a stripe shape. Subsequently, bumps (not shown) are formed on the p-electrodes 8 and the n-electrodes 9, and then scribing of the substrate 1 is carried out so that the substrate 1 is divided into rectangles having a predetermined size. Thus, as shown in FIG. 32, an integrated light emitting diode having a stripe light emitting part is obtained. The n-electrode 9 is formed to surround stripe mesa portions 5. As shown in FIG. 33, this integrated light emitting diode is mounted on a submount 72 composed of AlN or the like. On the submount 72, a lead electrode for p-electrode and a lead electrode for n-electrode (both not shown) are formed into a predetermined pattern shape, and solders 73 and 74 are formed on the lead electrodes. In the mounting, alignment is carried out so that the p-electrodes 8 and the n-electrode 9 of the integrated light emitting diode are placed over the solders 73 and 74, respectively, followed by melting of these solders 73 and 74 for bonding.

The embodiments of the present invention have been specifically described above. However, it should be noted that the present invention is not limited the above-described embodiments but various modifications based on the technical idea of the present invention might be incorporated.

For example, numeric values, materials, structures, shapes, substrates, ingredients, processes, the orientations of the projections 20 and the recesses 21, and so forth cited in the first to eleventh embodiments are merely examples. Other numeric values, materials, structures, shapes, substrates, ingredients, processes, orientations and so forth may be used according to need.

In addition, for example, two or more of the above-described first to eleventh embodiments may be combined according to need.

While preferred embodiments of the present invention have been described using specific terms, such description is for illustrative purposes, and it is to be understood that changes and variations may be made without departing from the spirit or scope of the following claims.

What is claimed is:

1. A light emitting diode comprising:
a first semiconductor layer of a first conductivity type;
an active layer on the first semiconductor layer;
a second semiconductor layer of a second conductivity type on the active layer;
a first electrode configured to be electrically coupled to the first semiconductor layer; and
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum,
wherein,
the first metal film is composed of a silver-indium alloy, a silver-palladium-copper alloy or a silver-niobium-copper alloy.

2. A light emitting diode comprising:
a first semiconductor layer of a first conductivity type;
an active layer on the first semiconductor layer;
a second semiconductor layer of a second conductivity type on the active layer;
a first electrode configured to be electrically coupled to the first semiconductor layer; and
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum,
wherein,
the second metal film has a thickness of at least ten nanometers.

3. A light emitting diode comprising:
a first semiconductor layer of a first conductivity type;
an active layer on the first semiconductor layer;
a second semiconductor layer of a second conductivity type on the active layer;
a first electrode configured to be electrically coupled to the first semiconductor layer;
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum; and
a third metal film configured to be provided on the second metal film and be composed of at least one metal selected from a group consisting of tungsten, molybdenum, and titanium.

4. A light emitting diode comprising:
a first semiconductor layer of a first conductivity type;
an active layer on the first semiconductor layer;
a second semiconductor layer of a second conductivity type on the active layer;
a first electrode configured to be electrically coupled to the first semiconductor layer;
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum;
a gold plated layer configured to be provided above the second metal film; and
a fourth metal film configured to be provided between the gold plated layer and the second metal film and be composed mainly of palladium and/or platinum.

5. The light emitting diode according to claim 1, wherein the first semiconductor layer, the active layer, and the second semiconductor layer are composed of a nitride III-V compound semiconductor.

6. The light emitting diode according to claim 1, wherein the first semiconductor layer is an n-type semiconductor layer and the second semiconductor layer is a p-type semiconductor layer.

7. A light emitting diode backlight in which a plurality of red light emitting diodes, a plurality of green light emitting diodes, and a plurality of blue light emitting diodes are arranged, at least one light emitting diode of the green light emitting diodes and the blue light emitting diodes comprising:
a first semiconductor layer of a first conductivity type;
an active layer on the first semiconductor layer;
a second semiconductor layer of a second conductivity type on the active layer;
a first electrode configured to be electrically coupled to the first semiconductor layer; and
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum.

8. A light emitting diode illumination device in which a plurality of red light emitting diodes, a plurality of green light emitting diodes, and a plurality of blue light emitting diodes are arranged, at least one light emitting diode of the green light emitting diodes and the blue light emitting diodes comprising:

a first semiconductor layer of a first conductivity type;
an active layer on the first semiconductor layer;
a second semiconductor layer of a second conductivity type on the active layer;
a first electrode configured to be electrically coupled to the first semiconductor layer; and
 a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum.

9. A light emitting diode display in which a plurality of red light emitting diodes, a plurality of green light emitting diodes, and a plurality of blue light emitting diodes are arranged, at least one light emitting diode of the green light emitting diodes and the blue light emitting diodes comprising:
a first semiconductor layer of a first conductivity type;
an active layer on the first semiconductor layer;
a second semiconductor layer of a second conductivity type on the active layer;
a first electrode configured to be electrically coupled to the first semiconductor layer; and
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum.

10. An electronic apparatus including one or a plurality of light emitting diodes, at least one of the light emitting diodes comprising:
a first semiconductor layer of a first conductivity type;
an active layer on the first semiconductor layer;
a second semiconductor layer of a second conductivity type on the active layer;
a first electrode configured to be electrically coupled to the first semiconductor layer; and
a second electrode configured to be provided on the second semiconductor layer and be electrically coupled to the second semiconductor layer, the second electrode including a first metal film that has a predetermined shape and is composed mainly of silver and a second metal film that covers the first metal film and is composed mainly of palladium and/or platinum,
wherein,
 the first metal film is composed of a silver-indium alloy, a silver-palladium-copper alloy or a silver-niobium-copper alloy.

* * * * *